(12) United States Patent
Yesinowski et al.

(10) Patent No.: US 10,775,459 B1
(45) Date of Patent: Sep. 15, 2020

(54) OPTORELAXERS FOR NUCLEAR MAGNETIC RESONANCE SPECTROSCOPY

(71) Applicant: The Government of the United States of America, as represented by the Secretary of the Navy, Arlington, VA (US)

(72) Inventors: James P. Yesinowski, Fort Washington, MD (US); Joel B. Miller, Cheverly, MD (US); Christopher A. Klug, Falls Church, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 193 days.

(21) Appl. No.: 16/043,068

(22) Filed: Jul. 23, 2018

Related U.S. Application Data

(60) Provisional application No. 62/635,275, filed on Feb. 26, 2018, provisional application No. 62/538,164, filed on Jul. 28, 2017.

(51) Int. Cl.
*G01R 33/46* (2006.01)
*G01R 33/30* (2006.01)
*G01R 33/44* (2006.01)

(52) U.S. Cl.
CPC ....... *G01R 33/4641* (2013.01); *G01R 33/307* (2013.01); *G01R 33/448* (2013.01); *G01R 33/4608* (2013.01)

(58) Field of Classification Search
CPC ................................. G01R 33/4641; G01R 33/307; G01R 33/448; G01R 33/4608
See application file for complete search history.

(56) References Cited

U.S. PATENT DOCUMENTS

| | | | |
|---|---|---|---|
| 2014/0273005 A1* | 9/2014 | Sillerud | G01N 33/57438 435/7.1 |
| 2015/0313471 A1* | 11/2015 | Dholakia | A61B 5/6852 600/411 |

FOREIGN PATENT DOCUMENTS

FR           3020719       * 11/2015

* cited by examiner

*Primary Examiner* — Tung X Nguyen
*Assistant Examiner* — Feba Pothen
(74) *Attorney, Agent, or Firm* — US Naval Research Laboratory; Hong-Vinh Nguyen

(57) ABSTRACT

The invention relates to compounds known as "optorelaxers," for example, spin crossover (SCO) complexes that exhibit light-induced excited state spin trapping (LIESST) effects with transient unpaired electron spins, which are created (or destroyed) by varying the level and/or wavelength of light to which the complexes are exposed. Light conditions are used to switch the optorelaxers between transient paramagnetic and diamagnetic states to provide real-time control of $T_1$ relaxation in nuclear magnetic resonance (NMR) spectroscopy methods. The optorelaxers and methods of the invention provide increased detection sensitivity of NMR spectroscopy, with increased structural information content, while maintaining resolution for a wide variety of different NMR-active nuclei.

11 Claims, 8 Drawing Sheets

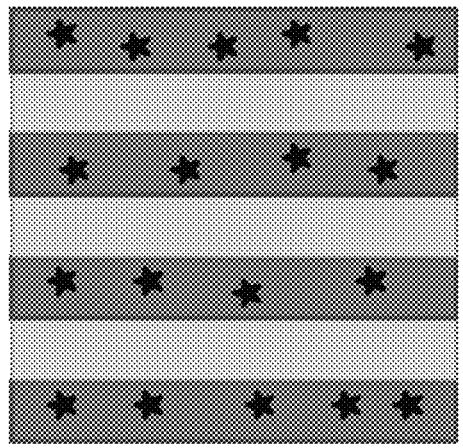
FIG. 2C
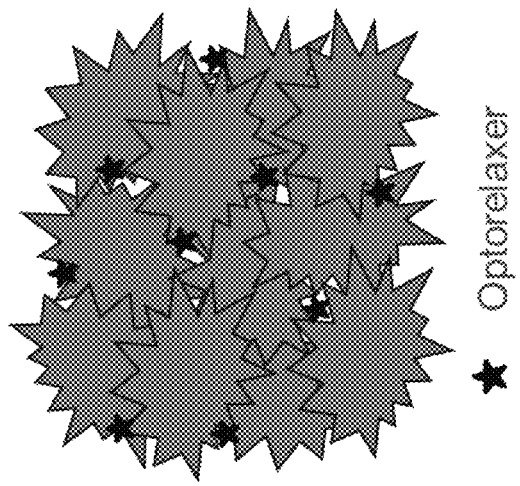
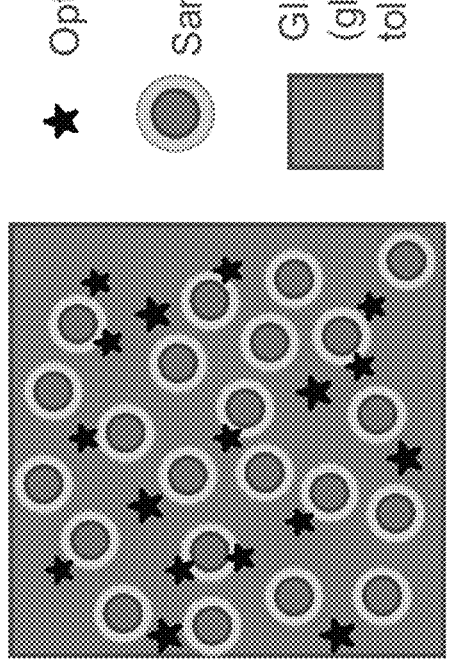
FIG. 2A
FIG. 2B

OPTORELAXERS FOR NUCLEAR MAGNETIC RESONANCE SPECTROSCOPY

CROSS-REFERENCE TO RELATED APPLICATIONS

This application claims priority to U.S. Provisional Application No. 62/538,164, filed on Jul. 28, 2017, and U.S. Provisional Application No. 62/635,275, filed on Feb. 26, 2018. The entire contents of each of these applications are incorporated herein by reference in their entirety.

TECHNICAL FIELD

This application relates generally to compounds known as "optorelaxers," for example, spin crossover (SCO) complexes that exhibit light-induced excited state spin trapping (LIESST) effects with transient unpaired electron spins, which are created (or destroyed) by varying the level and/or wavelength of light to which the complexes are exposed. Light conditions are used to switch the optorelaxers between transient paramagnetic and diamagnetic states to provide real-time control of $T_1$ relaxation in nuclear magnetic resonance (NMR) spectroscopy methods. The optorelaxers and methods of the invention provide increased detection sensitivity of NMR spectroscopy, with increased structural information content, while maintaining resolution for a wide variety of different NMR-active nuclei.

BACKGROUND OF THE INVENTION

NMR spectroscopy has been used for many years in the identification of compounds by comparing the spectra of known compounds with those of the compounds to be analyzed. Various techniques employed in this method of spectral analysis are described in the literature, and NMR spectrometers are commercially available. An early description of NMR spectroscopy is provided in U.S. Pat. No. 2,561,490 to Varian.

Generally, in the operation of an NMR spectrometer, a sample to be analyzed is positioned between the pole faces of a direct current electromagnet. Conventional NMR spectroscopy is carried out by applying a short radiofrequency pulse to the sample. A receiver coil obtains a responsive signal from the sample in the form of an induced voltage. The signal then decays over time (known as Free Induction Decay (FID), typically complete after tens of milliseconds in solids). After this voltage change is amplified and detected, the NMR spectrum (a pattern of intensity as a function of frequency), is produced. Interpretation of the resulting spectra makes it possible to determine the nuclei present in molecules and their relations to the remainder of the molecule. It is necessary to wait an interval for spin-lattice relaxation to restore the Boltzmann population difference between the spin levels in the sample back to equilibrium, in order for the spins to produce a new induced voltage signal that can then be added to previous signals. The time constant ($T_1$) characterizing this process depends upon many factors, but in solids, especially at low temperatures where sensitivity per single scan improves significantly, it can take many seconds, minutes, or even hours.

One method that has been used in NMR to decrease $T_1$ is to add small amounts of paramagnetic ions or reagents (e.g., radicals) that contain unpaired electron spins to the sample, which are known to reduce $T_1$. This method, Paramagnetic Relaxation Enhancement (PRE), suffers from the fact that the NMR spectrum from nuclei near the electron spins is broadened by the electron spins, limiting the useful concentration of relaxation agents that can be employed, and consequently the magnitude of the $T_1$ reduction and/or the achievable resolution.

NMR methods that increase the sensitivity of detection in bulk (i.e., not nanoscopic) samples fall under the general term "hyperpolarization." These involve creating population differences between nuclear spin Zeeman levels that are larger than the equilibrium Boltzmann population difference at the sample temperature. The methods may involve optical excitation ("optical pumping," typically of semiconductors at cryogenic temperatures) or microwave irradiation to saturate Electron Paramagnetic Resonance (EPR) transitions of permanently present paramagnetic species in a process known as Dynamic Nuclear Polarization (DNP). Significant hyperpolarization by DNP from transient paramagnetic species created by photoexcitation in single crystals of doped pentacene containing a UV-absorbing molecule has been demonstrated, but the sensitivity improvement is restricted to observing NMR signals from that single molecular crystal alone.

Other hyperpolarization methods require chemical reactions to occur, or transport of hyperpolarized molecules to the NMR spectrometer. The only method that has been used to improve NMR sensitivity by simply reducing spin-lattice relaxation times $T_1$ in solid samples is to add permanent paramagnetic species, which ultimately decreases resolution.

The interaction of unpaired electron spins with nuclear spins has played an important role in magnetic resonance spectroscopies since the earliest days of both NMR and Electron Paramagnetic Resonance (EPR) spectroscopy. The motivations for observing and interpreting such interactions vary widely. They range from obtaining atomistic information about electronic structure and delocalization of electrons (e.g. ENDOR hyperfine couplings, NMR Knight shifts, NMR contact shifts paramagnetic metal complexes), to gaining chemical structure information from distances obtained from electron-nuclear dipolar couplings, to improving the detection sensitivity of NMR by incorporating paramagnetic dopants.

With respect to improving detection sensitivity of NMR, there are two separate areas. The first area is the long-recognized ability of dopants such as transition metal ions to dramatically shorten the spin-lattice relaxation times $T_1$ of nuclei in solids via spin-diffusion, permitting more rapid data acquisition. PRE has been useful at ambient temperature in both solution NMR as well as solid-state NMR of proteins. The effects of electron spins in paramagnetic complexes as agents of rapid spin-lattice relaxation of the nuclear spins have been analyzed, revealing that in addition to the usual 'S-mechanism' an additional 'x-mechanism' arising from the thermal average of the electron spin polarization could significantly contribute to relaxation in tumbling paramagnetic molecules. The second area is the application of paramagnetic agents to increase the nuclear spin polarization with Dynamic Nuclear Polarization (DNP), by incorporating organic radicals and biradicals into samples and using microwave irradiation of the EPR transitions at temperatures of 100 K or lower.

The interaction of light with matter affects nuclear spins only indirectly, via electronic excitations that directly alter the electron spin states. The indirect effects of light upon nuclear spins can have important consequences in solids in such areas as Optically Pumped NMR (OPNMR) of semiconductors and NV-centers in diamond, and in photo-Chemically Induced DNP (photo-CIDNP) in photosynthetic reaction centers. For specific organic molecular crystals doped with absorbers and at low temperature, photoexcited triplet states can be created and used during their short lifetime as a source for DNP polarization via microwaves (MIONP, Microwave-Induced Optical Nuclear Polarization).

The aim of these NMR approaches involving irradiation with light is to achieve increased NMR sensitivity by greatly increasing the nuclear Zeeman spin level population differences beyond the Boltzmann level. Irradiation with light has also been observed to reduce nuclear $T_1$ values in specialized systems.

However, the broader goal of improving NMR detection sensitivity without degrading resolution remains unrealized.

SUMMARY OF THE INVENTION

The invention described herein, including the various aspects and/or embodiments thereof, meets the unmet needs of the art, as well as others, by providing optorelaxers for use in nuclear magnetic resonance (NMR) spectroscopy. The optorelaxers are used in NMR spectroscopy methods that provide real-time control of NMR relaxation by controlling light/dark conditions. Computer-readable media and logic for performing the NMR spectroscopy methods are also provided. The NMR methods of the invention provide increased detection sensitivity of NMR spectroscopy, with increased structural information content, while maintaining resolution for a wide variety of different NMR-active nuclei.

In accordance with one aspect of the invention, a method for performing NMR includes providing a sample for NMR analysis; adding an optorelaxer to the sample; exposing the sample and optorelaxer to a first light condition that causes the optorelaxer to adopt a paramagnetic form; exposing the sample and optorelaxer to a second light condition that causes the optorelaxer to adopt a diamagnetic form; applying a radiofrequency pulse to the sample and paramagnetic form of optorelaxer; obtaining a signal from the sample in the presence of the diamagnetic form of optorelaxer.

Other features and advantages of the present invention will become apparent to those skilled in the art upon examination of the following or upon learning by practice of the invention.

BRIEF DESCRIPTION OF THE DRAWINGS

FIGS. 2A-2C are diagrams illustrating several possible ways of incorporating optorelaxers into an NMR sample. FIG. 2A shows the optorelaxer and sample in a matrix. FIG. 2B shows a polymer film system with two phases, one with optorelaxer and the other without. FIG. 2C shows a high surface area material with optorelaxer.

DETAILED DESCRIPTION OF EMBODIMENTS OF THE INVENTION

The invention described herein, including the various aspects and/or embodiments thereof, meets the unmet needs of the art, as well as others, by providing compounds known as "optorelaxers", for example, spin crossover (SCO) complexes that exhibit light-induced excited state spin trapping (LIESST) effects with transient unpaired electron spins, which are created (or destroyed) by varying the level and/or wavelength of light to which the complexes are exposed. Light conditions are used to switch the optorelaxers between transient paramagnetic and diamagnetic states to provide real-time control of $T_1$ relaxation in nuclear magnetic resonance (NMR) spectroscopy methods. The optorelaxers and methods of the invention provide increased detection sensitivity for NMR spectroscopy, with increased structural information content, while maintaining resolution for a wide variety of different NMR-active nuclei.

Figure 1A:
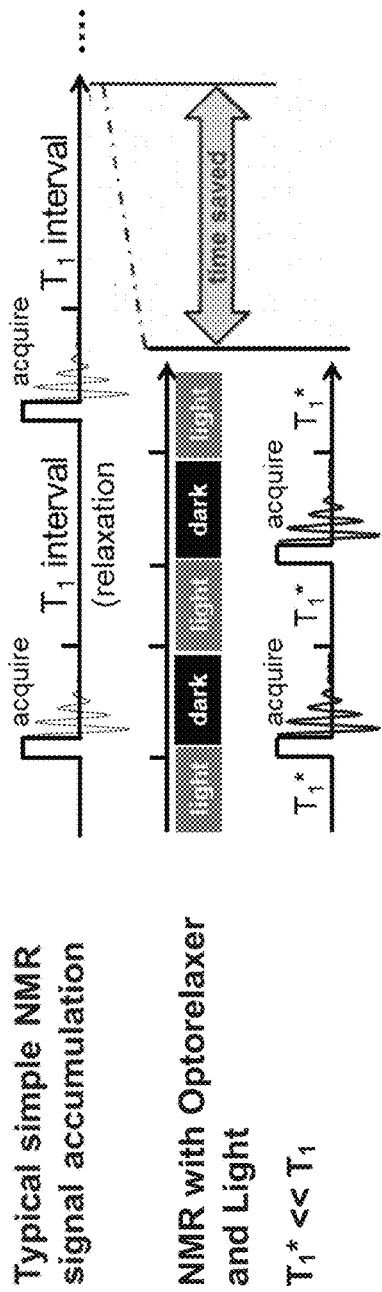
FIG. 1A is a diagram comparing an ordinary NMR spectroscopy technique with NMR spectroscopy performed using optorelaxers.
Figure 1B:
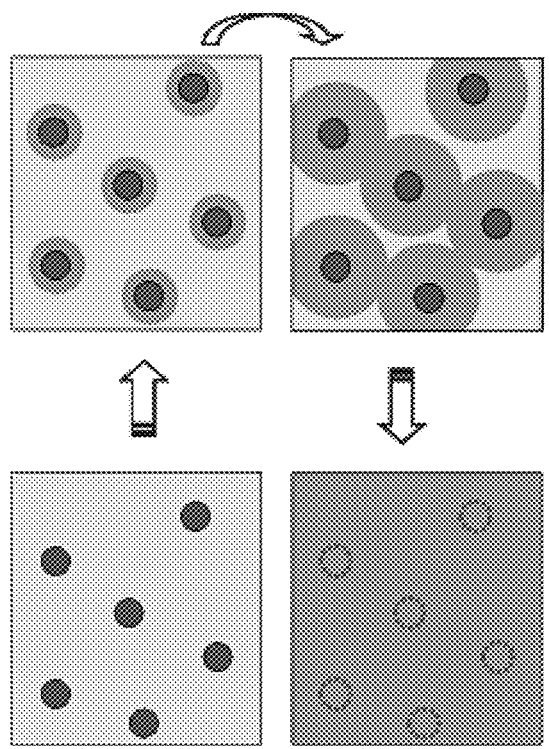
FIG. 1B is a diagram showing the spread of buildup of nuclear magnetization from optorelaxer to surroundings via spin diffusion.

The invention overcomes a fundamental difficulty of conventional NMR spectroscopy techniques by using light to create (and optionally to destroy) excited states with transient unpaired electron spins in optorelaxer compounds that provide real-time control of NMR $T_1$ relaxation, as illustrated in FIG. 1A. The nuclei are restored to equilibrium in a time $T_1*$ that can be much shorter than $T_1$ in the intervals during which the sample is illuminated. However, during the (typically much shorter) period when the Free Induction Decay (FID) signal is obtained, the sample is in the dark or under light conditions that do not create the paramagnetic state, and no unpaired electron spins are present. The absence of paramagnetic forms of optorelaxers in the sample during the FID acquisition maintains high resolution. In some aspects, turning off the light causes the transient unpaired electron spins to decay to the diamagnetic ground state very quickly compared to the intervals involved. An alternative method uses light of a different (typically longer) wavelength to switch off the transient paramagnetism. The time-sequence of the spread of buildup of nuclear magnetization from the optorelaxer to its surroundings via spin diffusion is depicted in FIG. 1B.

Optorelaxers

The term "optorelaxer" refers to photoexcitable molecules having a number of properties. They are capable of being incorporated as isolated molecules (or possibly nanocrystallites) in a sample containing the nuclear spins whose NMR spectrum is desired. In some aspects, this might be in an amorphous or glassy matrix formed from materials that are liquid at room temperature (e.g. glycerol/water mixtures used in DNP experiments on proteins, sugar-water mixtures, toluene, etc.), or from solid-like polymer films made by solvent evaporation.

The optorelaxers of the invention may be selected from any compound that forms a photoexcited triplet or higher electron spin state upon exposure to electromagnetic radiation. The compounds should be photostable at least over the duration of the NMR spectroscopy experiment, i.e., they should not degrade or lose their paramagnetic properties (e.g., the ability to become paramagnetic upon irradiation with light).

A wide variety of chemical compounds may represent suitable optorelaxers depending upon the experimental conditions used. These include organic molecules with photo-excited triplet states such as arylbenzophenones, porphyrins, phthalocyanines, and dyes. They also include donor-acceptor complexes that spatially separate the photogenerated unpaired electrons, similar to those present in photosynthetic processes. A wide class of compounds known as Spin-Crossover (SCO) complexes, largely based upon first row transition metal ions (i.e., ions of Ti, V, Cr, Mn, Fe, Co, Ni, and Cu, and may also include Zn) and having d4 to d7 electronic configurations is a promising source of optorelaxer molecules. Fe(II) and Fe(III) SCOs are preferred in some aspects of the invention. SCOs exhibiting high spin (HS) and low spin (LS) states that can be switched using external stimuli, such as temperature, pressure, and light, are encompassed by the optorelaxers of the invention.

The optorelaxer compounds of the invention may exhibit paramagnetism when illuminated, and diamagnetism in the absence of illumination. The light used to illuminate the optorelaxers and induce paramagnetism may be selected from any wavelength(s) in the visible region of the optical spectrum, or near this region. According to one embodiment, white light is preferred, i.e., light comprising wavelengths from across the visible spectrum (from about 390 nm to about 700 nm) that appears colorless, although the invention is not limited to use of white light. In other aspects of the invention, optorelaxers that exhibit paramagnetism when exposed to electromagnetic radiation having wavelengths in the ultraviolet range (from about 100 nm to about 400 nm) or infrared (from about 700 nm to about 1000 nm) are also provided. In one preferred aspect of the invention, prismatic high-intensity (40 W) white light from an LED source is used, in conjunction with a liquid light guide, 600 nm filter, and a lens system for directing a collimated beam to the NMR probe of the NMR spectrometer. The optical filters are optional, but in some aspects, they can be used to provide a light source having custom color temperature (i.e., 6500 K). Other light intensities and characteristics may be provided, depending on the desired effect on paramagnetism of the optorelaxer compound. Optical fibers or optical windows may be provided as an alternative to the liquid light guide.

Spin crossover (SCO) complexes that exhibit light-induced excited state spin trapping (LIESST) effects with transient unpaired electron spins are preferred for use as optorelaxers. Complexes for use as optorelaxers may include, but are not limited to, $Fe(II)(ptz)_6(anion)_2$, $Fe(II)(ptz)_6(BF_4)_2$ ("FePTZ"), $Fe(II)(R\text{-}trz)_3(anion)_2$, $Fe(NH_2trz)_3(anion)_2$ ("FeTRZ"), $Fe(phen)_2(NCS)_2$, $Fe(btzp)_3(ClO_4)_2$, $CrI_2(depe)_2$, $[Fe(bpym)(NCS)_2]_2bpym$. In these formulas, ptz=1-propyltetrazole, trz=1,2,4-triazole, btzp=1,2-bis(tetrazol-1-yl)propane), phen=1,10-phenanthroline, depe=diethylphoshinoethane, and bpym=2,2'-bipyrimidine. R may be selected from $NH_2$ and H. When (anion) is indicated, the anion may be any suitable anion, including, but not limited to $BF_4$, NCS, $ClO_4$, $NO_3$, and halogen ions.

The optorelaxers may optionally be in the form of hydrated compounds, complexed with one or more molecules of water.

Additional optorelaxers for use in the invention may include, but are not limited to, Pt Porphyrin-Rhodamine B Dyads, polypentacene-related molecules, and organic luminophors (e.g., 1-(dibenzo[b,d]furan-2-yl)phenylmethanone (BDBF)).

According to one presently-preferred embodiment, the LIESST complex $Fe(II)(ptz)_6(BF_4)_2$ is used as the optorelaxer. The crystalline complex of FePTZ is paramagnetic (high-spin, S=2, quintet state) at room temperature, but below about 130 K becomes diamagnetic (low-spin, S=0, singlet state). However, irradiation of this low-temperature low-spin form by visible light at 505 nm creates the high-spin state, which can persist for a long time (many minutes at low temperature), or which can be converted back to the low-spin form by irradiation at about 850 nm. The NMR spectrometers for use in accordance with the invention can be optimized for use at a variety of temperatures, from about 4 K to about 300 K, although temperatures well below 4 k are achievable and offer very high nuclear polarization levels. In one aspect, a continuous flow cryostat with sapphire window is used to achieve this range of temperatures. The sample temperature and optorelaxer temperature may therefore be controlled precisely so that measurements can be taken at relevant temperatures, including, but not limited to, 30 K, 80 K, and 290 K.

A schematic illustrating several types of possible ways of incorporating optorelaxers into the NMR sample is shown in FIGS. 2A-2C. The samples that may be used in conjunction with the optorelaxers of the invention are not particularly limited, and may be samples suitable for use in liquid NMR or solid-state NMR techniques. In some aspects of the invention, solid-state NMR samples and techniques are preferred.

As shown in FIG. 2A, the optorelaxers of the invention may be incorporated into an NMR sample for use in NMR spectroscopy. A glassy matrix of glycerol and water, toluene, or other glass-forming liquids may have the sample and the optorelaxers dissolved or suspended therein.

Alternatively, as shown in FIG. 2B, two-phase systems are provided where the first phase includes polymer blends, nanolayered polymer films, or samples with imbibed glass-forming liquids, where the first phase includes the optorelaxer, and the second phase does not include optorelaxers. The film layers may be arranged such that a film layer having the optorelaxer therein is alternated with a film layer not including the optorelaxer. Thin films containing crystals or individual molecules of the optorelaxer compound may be formed by incorporating them into a glassy polymer matrix along with the sample. In some aspects, the polymer matrix may be formed by solvent or spin casting using any suitable polymer, provided that the matrix material does not degrade the optorelaxers or sample, or prevent light from reaching the optorelaxer or sample. Matrix materials may include polycarbonate, polyether sulfone, polyetherimide, polyimide, polymethyl methacrylate, Nafion®, polyvinyl chloride, polystyrene, and polyvinyl alcohol polymers. In some aspects, a polystyrene matrix is preferred. In other aspects, films containing optorelaxers may be provided as a single film matrix having the optorelaxers and sample distributed therethrough.

In another aspect shown in FIG. 2C, optorelaxers are incorporated with high surface area materials in order to provide direct relaxation of nearby nuclei followed by spin diffusion in to the interior for abundant nuclei, and cross-polarization to dilute nuclei. This technique may beneficially provide new distance-related information.

Figure 3:
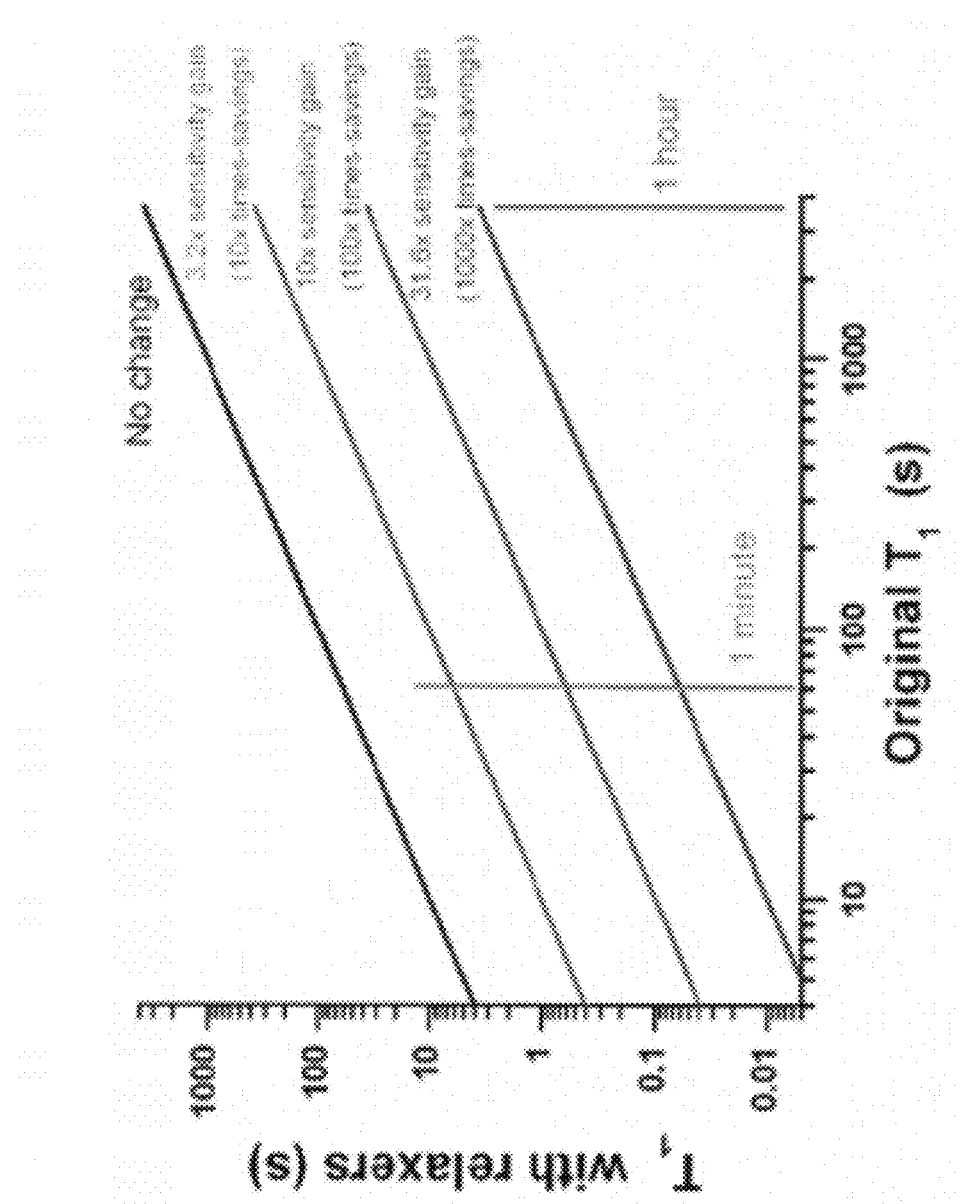
FIG. 3 is a graph of calculated sensitivity gains achievable by performing NMR spectroscopy using optorelaxers.

The calculated sensitivity gains achievable by employing the optorelaxers of the invention are shown in FIG. 3. The horizontal axis represents the sample $T_1$ in the absence of any optorelaxer, and the vertical axis is the assumed $T_i$ with optorelaxer present. The three plots represent hypothetical sensitivity (signal-to-noise ratio) and total experiment time savings gained for optorelaxers with differing degrees of effectiveness. Additional improvements in sensitivity may be achievable by a combination of optorelaxer and Dynamic Nuclear Polarization (DNP), in NMR probes that allow for illumination by both light and microwaves. The transient unpaired electron spins generated by light can serve to enhance nuclear spin polarization by the DNP effect under microwave irradiation. The advantage over simple DNP, as conventionally carried out, is that much higher concentrations of unpaired electron spins are feasible, since no additional spectral broadening results from using optorelaxers whose magnetism is absent during data acquisition.

The ability of FePTZ to function as an optorelaxer for the protons in a polymeric matrix is demonstrated in the Examples. FePTZ, and other SCOs exhibiting LIESST properties, possess three important advantages as optorelaxers over organic photoexcited triplet states. First, the relative relaxivity of optorelaxers goes as S(S+1), and thus is 3 times greater for the quintet (S=2) photoexcited state as for a triplet (S=1) photoexcited state (such as those that often result from photoexcitation of organic molecules). Second, the electron spin $T_1$ values for transition metal ions are typically very short (ns regime), as desired. Third, the lifetime of the excited state can be tuned to be optimal for a particular NMR experiment by changing the temperature, since the conversion to the ground state is thermally activated. At low temperatures they can have excited state lifetimes $\tau_{exc}$ that depend strongly upon temperature and become very long (e.g., hours). This feature enables higher concentrations of long-lived photoexcited states to be achieved. Finally, the photoexcited states thus created can be removed (effectively shortening $\tau_{exc}$ in a different period) by de-excitation with irradiation at longer wavelengths, or by relatively modest temperature changes. They also have the potential to permit $\tau_c$ to be adjusted for optimal relaxivity by varying the temperature over a relatively small range, since electron spin-lattice relaxation mechanisms can be very strongly temperature-dependent. Further advantages are that compounds in this class are photostable and have functionalizable ligands. This ability to create time-sequenced photomagnetism at will is ideal for maximizing the benefits of optorelaxers.

Figure 4A:
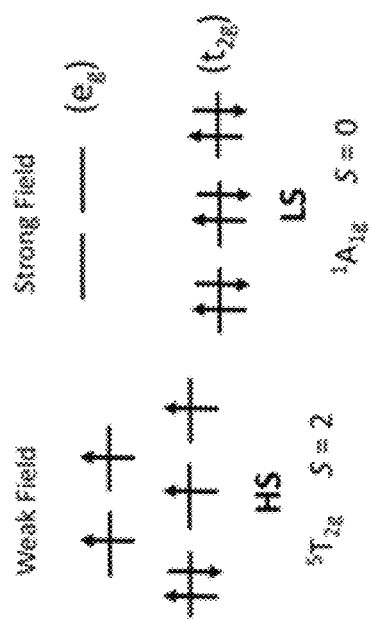
FIG. 4A depicts high-spin and low-spin configurations of $d^6Fe(II)$.
Figure 4B:
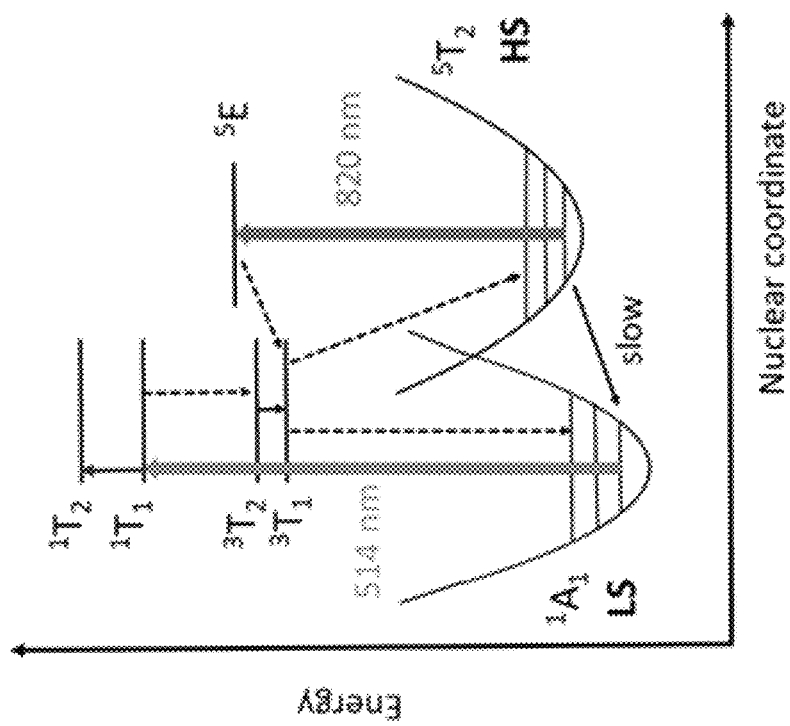
FIG. 4B is a Jablonski diagram for FePTZ showing LIESST (left) and reverse LIESST (right) optical transitions, with fast ISC processes indicated by dashed arrows, and the most recent ordering of the $^3T_2$ state with respect to the $^5E$ state depicted.

The phenomenon of SCO involves changes between high-spin and low-spin forms of a compound that are induced by external perturbations (most commonly temperature). The majority of SCO complexes involve d4-d7 transition metal ions involve octahedral monodentate nitrogen-containing ligands, i.e. Fe(II)N$_6$. For Fe(II), the high-spin (HS) form is a quintet state with S=2 and the low-spin (LS) form is a singlet state with S=0 (see FIG. 4A). The Fe—N bond lengths in the LS form can be up to 10% shorter than those in the HS form, because the latter has electrons in antibonding orbitals. This favorable enthalpy term stabilizes the LS form at low temperatures, but vibrational and configurational entropy stabilize the HS form at higher temperatures. For pure crystalline forms of the SCO complexes, the thermal transition is cooperative and abrupt with a small hysteresis, occurring typically around 130 K. However, the SCO phenomenon is essentially a characteristic of the single ion complex itself, since it is observed to take place for magnetically dilute solid solutions of complexes (e.g. dilute Fe(II) in Zn(II) complexes, as well as in solution, and in polymer matrices. FIG. 4A shows high-spin and low-spin configurations of $d^6$Fe(II). FIG. 4B is a Jablonski diagram for FePTZ, showing LIESST (left) and reverse LIESST (right) optical transitions. Fast ISC processes are indicated by dashed arrows. The slow HS→LS transition rate can vary over many orders of magnitude. The most recent ordering of the $^3T_2$ state with respect to the $^5E$ state is shown.

The ability of irradiation with electromagnetic energy (i.e., visible light, UV light, infrared light) to induce a transition from the LS to the HS form of an SCO complex, with the HS form persisting for a long time at low temperatures, is known as the LIESST effect. This was first observed in FePTZ, which is the most extensively studied LIESST complex. The conversion is effected by irradiation with green light into the $^1A_1 \rightarrow ^1T_{1,2}$ absorption bands followed by two intersystem crossing (ISC) processes $^1T_{1,2} \rightarrow ^3T_{1,2} \rightarrow ^5T_2$ that populate the quintet HS state (see FIG. 4B). Since the absorbing LS state is pink and the HS state colorless, the light will penetrate further into the sample with time as more HS complexes are formed. The decay rates of the photoexcited HS form back to the ground state LS form vary enormously depending upon the complex, the matrix and the temperature. The quantum efficiency of LIESST in FePTZ at 10 K is very high, 0.8, and thus the photon flux is used efficiently, a desired feature for the optorelaxers of the invention. While "tuning" the decay rates to be optimal for any particular NMR application represents one possibility for removing the broadening effects of photoparamagnetism during the FID acquisition interval, another means of seeking the same ends is the reverse LIESST effect. Here, longer wavelength red light is used to excite the $^5T_2 \rightarrow ^5E$ transition, which by two ISC processes $^5E \rightarrow ^3T_{1,2} \rightarrow ^1A_1$ return the system to its LS ground state (FIG. 4B). The quantum efficiency of the reverse LIESST process is also significant, 0.1, implying a reasonably efficient utilization of the photon flux.

Methods

Different modalities of employing optorelaxers are provided that are within the scope of the methods of the invention. The optorelaxers may be used at various temperatures, with various wavelengths of electromagnetic radiation, and in various time intervals in accordance with the inventive methods for conducting NMR spectroscopy.

The most commonly used NMR nuclei are $^1H$ and $^{13}C$, although isotopes of many other elements (e.g. $^2H$, $^6Li$, $^1B$, $^{11}B$, $^{14}N$, $^{15}N$, $^{17}O$, $^{19}F$, $^{23}Na$, $^{29}Si$, $^{31}P$, $^{35}Cl$, $^{113}Cd$, $^{129}Xe$, $^{195}Pt$) have been studied by high-field NMR spectroscopy as well. Methods for using optorelaxers to improve detection sensitivity of NMR spectroscopy with respect to any of these elements, while maintaining resolution, are provided.

Methods are provided for increasing the detection sensitivity of NMR by using temperature and/or light to create transient paramagnetic species from optorelaxer molecules. In this approach, the transient nature of the photoparamagnetism beneficially makes it possible to avoid degradation of spectral resolution created by paramagnetic broadening. Light may be used to create transient paramagnetic species from introduced optorelaxers. Wavelengths ranging from ultraviolet to infrared may be used, depending on the specific optorelaxer used. In some aspects of the invention, white light is preferred, i.e., light comprising wavelengths from across the visible spectrum (from about 390 nm to about 700 nm) that appears colorless, although specific wavelengths may be selected within the visible spectrum. In other aspects of the invention, methods for conducting NMR spectroscopy using optorelaxers that exhibit paramagnetism when exposed to electromagnetic radiation having wavelengths in the ultraviolet range (from about 100 nm to about 400 nm) or infrared (from about 700 nm to about 1000 nm) are also provided. These methods rely on the inclusion of optorelaxers that are paramagnetic when exposed to light of a first wavelength, and diamagnetic when exposed to light of a second wavelength (or when the light of the first wavelength is removed, e.g., when in darkness). The diamagnetic form of the optorelaxer may beneficially decrease the spin-lattice relaxation time $T_1$ in a sample via relaxation mechanisms not involving unpaired electron spins (e.g., methyl group rotation), allowing for more rapid data acquisition.

The methods of the invention are carried out by providing a sample to be analyzed using NMR, and adding an optorelaxer to the sample. Spin crossover (SCO) complexes that exhibit light-induced excited state spin trapping (LIESST) effects with transient unpaired electron spins are preferred for use as optorelaxers. Complexes for use as optorelaxers may include, but are not limited to, $Fe(II)(ptz)_6(anion)_2$, $Fe(II)(ptz)_6(BF_4)_2$ ("FePTZ"), $Fe(II)(R-trz)_3(anion)_2$, $Fe(NH_2trz)_3(anion)_2$ ("FeTRZ"), $Fe(phen)_2(NCS)_2$, $Fe(btzp)_3(ClO_4)_2$, $CrI_2(depe)_2$, $[Fe(bpym)(NCS)_2]_2bpym$. In these formulas, ptz=1-propyltetrazole, trz=1,2,4-triazole, btzp=1,2-bis(tetrazol-1-yl)propane), phen=1,10-phenanthroline, depe=diethylphoshinoethane, and bpym=2,2'-bipyrimidine. R may be selected from $NH_2$ and H. When (anion) is indicated, the anion may be any suitable anion, including, but not limited to $BF_4$, NCS, $ClO_4$, $NO_3$, and halogen ions. The optorelaxers may optionally be in the form of hydrated compounds, complexed with one or more molecules of water. The sample and optorelaxer may be provided at a first temperature that results in the optorelaxer being at its low-spin, diamagnetic state.

The sample and optorelaxer are then exposed to a first light condition that causes the optorelaxer to adopt its high-spin, paramagnetic state. In some aspects, the first light condition is selected from visible light, ultraviolet light, and infrared light. Preferably, the light is visible light. In some aspects of the invention, the visible light is white light.

The sample and optorelaxer are exposed to a second light condition that causes the optorelaxer to return to its diamagnetic state, and causes a decrease in spin-lattice relaxation time. In some aspects, the second light condition is a longer wavelength of light than the first light condition. In other aspects, the second light condition is darkness. In some aspects of the invention, the sample and optorelaxer may optionally be subjected to temperature cycling during this step. A radiofrequency pulse may be applied to the sample and the paramagnetic form of the optorelaxer using the NMR spectrometer, and an NMR signal may be obtained from the sample in the presence of the diagmanetic form of the optorelaxer.

The process of exposing the sample and optorelaxer to the first light condition, switching to a second light condition, applying the radiofrequency pulse, and then obtaining the signal under the second light condition may be repeated. The presence of the optorelaxer shortens the spin-lattice relaxation time, permitting more scans in a given period of time than a sample being analyzed without the presence of the optorelaxer.

Improving the detection sensitivity of NMR may be defined as increasing the signal-to-noise ratio per unit time in a spectrum obtained from multiple acquisitions of free induction decays (FIDs). Lower temperatures are used to increase the signal level per scan (i.e., larger Boltzmann population differences between spin levels), but the lower temperatures result in longer $T_1$ values, especially in solids. This necessitates longer wait times between scans, and less signal per unit of time (i.e., lower sensitivity). Decreasing $T_1$ through the methods of the invention permits more scans in a given period of time. This beneficially improves sensitivity of the NMR measurements.

The optorelaxers of the invention differ from non-transient paramagnetic species in that they are capable of providing transient photoparamagnetism (i.e. photomagnetism not involving ferromagnetism) that can be arranged to be absent during the relatively short time each FID is acquired. The inhomogeneous spectral broadening effects at high concentrations of paramagnetic species resulting from electron-nuclear dipolar and pseudocontact interactions can thereby be avoided. Thus, optorelaxers improve sensitivity in high-resolution NMR experiments involving Magic Angle Spinning (MAS) or Magic Angle Turning (MAT), or for static NMR of intrinsically sharp peaks, without degradation of resolution. In such cases, the ability to maintain high-resolution also increases the detection sensitivity in terms of the integrated signal-to-noise ratio over the bandwidth of the peak width, or equivalently the peak height-to-noise ratio for a peak apodized using a matched filter.

This transient paramagnetic behavior can be accomplished by relying on a rapid natural decay of photoparamagnetism in a dark period during which the FID is acquired. It might also be achieved in some cases by modest thermal cycling from a first temperature to a second temperature, or by irradiation with light of a different wavelength just before the FID is acquired.

The inhomogeneous spectral broadening effects of paramagnetic species are greater at low temperatures due to the increase in the thermally-averaged magnetic moments of the electron spins. Therefore, at low temperature there is a greater relative advantage to employing the optorelaxers of the invention rather than permanent paramagnetic species to shorten $T_1$, in terms of avoiding spectral broadening. Obtaining NMR spectra at low temperatures may be desirable for the potential sensitivity improvement to be gained by the increased Boltzmann population differences between Zeeman levels. The Boltzmann population differences between equally-spaced Zeeman levels for all nuclei at accessible magnetic field strengths scale simply as 1/T for temperatures above ~10 mK. Because in typical low-temperature NMR probes the coil is also at the same lower temperature and thus has less Johnson noise, the actual sensitivity gain is more like $T^{3/2}$. Thus, a temperature decrease from 300 K to 30 K would yield a 32-fold improvement in single-scan detection sensitivity for a sample with an equilibrium polarization. Unfortunately, it is well known that $T_1$ generally becomes much longer at such low temperatures. For example, paramagnetic dopants were necessary to reduce long proton $T_1$ values of hours or minutes in model bioinorganic complexes below 25 K. As examples of very long $T_1$ values at room temperature that are expected to increase even further at low temperatures, the $^{29}Si$ $T_1$ in lightly-doped silicon is ~4 hours, and hours or minutes in silicon nanoparticles. The usefulness of an optorelaxer in any particular sample will depend upon the ratio of the original $T_1$ to $T_{1(opto)}$ due to the effect of the optorelaxer, rather than upon the absolute values of $T_1$.

The transient unpaired electron spin (transient photomagnetism) of optorelaxers serves as a highly efficient means of directly relaxing nuclear spins that are in spatial proximity (e.g. within nm distances), and indirectly over distances many tens of nm. This effect may be termed "Optically- Nucleated Relaxation" ("ONR"). The $T_1$ values of NMR nuclei limit the rate at which repetitive acquisitions of the NMR free-induction decay (FID) can be co-added to improve the signal-to-noise ratio of the resultant spectrum obtained by Fourier-transformation. The ability to more rapidly acquire FID signals by shortening Li is one key advantage of the method of real-time control of NMR relaxation of the invention, especially when compared to optical pumping and other polarization enhancement methods, e.g., dynamic nuclear polarization (DNP), which typically require minutes to hours to build up polarization for a single detection scan. In addition, DNP is experimentally demanding and costly since it requires a microwave source and introducing microwaves into specially-designed NMR sample probes.

Unpolarized light creates uniformly dispersed paramagnetic species of photoexcited molecules that act as relaxation agents only while in the excited state for the NMR nuclei of interest embedded in a 3-D solid matrix. The ability of low concentrations of permaent paramagnetic species such as many transition metal ions to greatly shorten $T_1$ of NMR-active nuclei such as protons ($^1$H) in solids via the process of spin-diffusion has been known since the earliest days of NMR; however, transient photomagnetism of optorelaxers represents a novel advance having a number of advantages. Importantly, no spectral broadening is observed during signal detection in the dark, because of the relatively short lifetimes of these photoexcited relaxation agents. Therefore, the sensitivity increase is obtained without any decrease in resolution—a key advantage. The cryogenic temperatures used in our approach (which typically could extend over the range of liquid helium at 4.2 K and liquid nitrogen at 77 K) provide a significant sensitivity advantage vis-a-vis room temperature NMR because of the greater Boltzmann population difference between the Zeeman energy levels of the NMR transitions at low temperature.

The $T_1$ relaxation times of those nuclei closest to the photoexcited optorelaxer molecules or nano- or micro-crystallites are reduced the most. Therefore, this method can be surface selective in cases where spin-diffusion is not a factor (e.g. dilute NMR nuclei), since it can preferentially enhance signals from nuclei in the outer shells of nanoparticles of interest. Another significant experimental option for spatial selectivity is to target the location of the relaxing agents to a specific region of the material of interest using an optorelaxer molecule that preferentially interacts with that region (through hydrophobic, hydrophilic, ionic, covalent, etc., interactions). The distances between the NMR nucleus being observed and the unpaired electron spins can be measured from observing spectral shift s due to dipolar couplings between electrons and nuclei in 2D-NMR experiments where the first (incremented) time interval ($t_1$) correspond s to evolution in the presence of illumination, and the second acquisition interval ($t_2$) occurs in the absence of illumination.

Although direct relaxation of nuclear spins by photoexcited optorelaxers is a local process, the effects may be spatially extensive in some cases. For example, the optorelaxer may serve to reduce the $T_1$ of abundant proton spins via the process of rapid spin diffusion among abundant proton spins in a matrix. This process transports the thermal polarization rapidly generated at the optorelaxer molecule to the rest of the sample, just as is the case for paramagnetic metal ions in proteins or for non-thermal polarization in DNP experiments employing radicals.

Such abundant proton spins could occur in both the matrix itself, as well as in any organic, organometallic, or biomolecule, biomembrane, or nanocrystallite within the matrix. This would allow for more frequent repetition of cross-polarization to the other nuclei whose NMR spectrum are sought, typically under high-resolution magic angle spinning (MAS) conditions. In other cases, the local effects of photoexcited optorelaxers directly relaxing those nuclear spins whose NMR spectrum are sought may be sufficient. Examples include surface spins of inorganic nanoparticles, such as found in bone or quantum dots of semiconductors.

Optorelaxers shorten nuclear spin $T_1$ values in real-time by virtue of the photoparamagnetism produced by light irradiation. They also allow for real-time loss of this photoparamagnetism by either natural decay processes or by external factors such as light of a different wavelength or temperature changes. A typical solid-state NMR experiment, whether 1D or multidimensional, consists of three periods: 1) a single pulse or a sequence of pulses and delays; 2) an acquisition period for the FID, which may involve decoupling; and 3) a relaxation (or recycle) delay to allow the observed nuclear spins to partially or totally equilibrate on the time scale of their $T_1$ values before repeating the three steps. The relaxation delay step is often long compared to the acquisition period, which can be made as short as possible consistent with the degree of resolution achieved (i.e., several $T_2$*). In an optorelaxer experiment, light that produces photoparamagnetism would be turned on during all of the (new) relaxation delay interval. This new interval will be significantly shorter than the corresponding interval without optorelaxers, since the $T_{1(opto)}$ of the sample in the presence of photoparamagnetism is shorter than $T_1$ in the dark. A fourth interval immediately after the new relaxation delay would be present in the optorelaxer experiment, during which decay of the transient photoparamagnetism could occur by any of the means described above. The light could be turned off in the first interval, as well as in the acquisition period, during both of which photoparamagnetism is absent.

A reasonable quantum efficiency for the creation of photoparamagnetism is desirable to maximize the utilization of photons. The illumination time chosen will reflect the compromise between two factors: 1) being short enough to allow FID's to be acquired more rapidly than under conditions of an unaltered $T_1$; 2) being long enough to create a high degree of photoparamagnetism and relaxivity. The exact compromise in any given situation will depend strongly upon experimental conditions such as light intensity, temperature, and optorelaxer photokinetics and concentration. Some optorelaxers might function by having a sufficiently short decay time $\tau_{exc}$ of the photoexcited paramagnetic state when the light is turned off. In other cases, being able to hasten this decay by external means such as irradiation with a second wavelength of light could prove very advantageous (the optorelaxer FePTZ described herein has such a feature). A related requirement of optorelaxers is that they be photostable for at least the duration of the NMR experiment.

The spin-lattice relaxation of a nuclear spin due to the dipolar interaction with an electron spin arises from a term in the spin Hamiltonian involving geometric functions and spin operators that describes the hyperfine interaction $A = C\, r^{-3} \sin\theta \cos\theta\, e^{-i\phi} S_z I^+$, where C is a constant, $\theta$ and $\phi$ define the orientation of the electron-nucleus vector of length r with respect to the external magnetic field $B_0$, $S_z$ is the (fluctuating) z-component of the electron spin S, and $I^+$ is the nuclear spin-raising operator that corresponds to a nuclear spin flip. Defining $\tau_c$ as the correlation time of the z-component of the electron spin, $\omega_I = \gamma_I B_0$ and $\omega_S = \gamma_S B_0$ as the nuclear and electron Larmor frequencies, with $\gamma_I$ and $\gamma_S$ the nuclear and electron gyromagnetic ratios, respectively, and the spin-lattice relaxation rate $T_1^{-1}$ at a vector position r with respect to a single fixed paramagnetic site can be expressed as:

$$\frac{1}{T_1} = 3\sin^2\theta \cos^2\theta \; \gamma_I^2 \; \gamma_S^2 \; \hbar^2 S(S+1) \times \frac{1}{r^6} \times \left(\frac{\tau_c}{1+\omega_I^2 \tau_c^2}\right). \quad \text{(Equation 1)}$$

Relaxation of a single nuclear spin by multiple paramagnetic sites simply involves a summation of the individual rates. The derivation of this equation assumes that $\omega_I \tau_c \ll \omega_S \tau_{c'}$, as generally expected in the solid state, where $\tau_{c'}$ is the correlation time of the x- or y-component of the electron spin. Although $\tau_c$ is sometimes viewed as equal to the $T_1$ of the electron spin, it may actually be shorter if electron-electron spin flips are allowed, e.g., via strong dipolar interactions between the electrons when there is a high concentration of electron spins. Knowledge of electron spin-lattice relaxation times that relate to $\tau_c$ in Equation 1 for transition metal ions or complexes is very limited and difficult to obtain. Equation 1 expresses the fact that the spin-lattice relaxation rate is proportional to the square of the hyperfine interaction A. It also assumes that the electron Zeeman interactions are dominant. Therefore, it no longer quantitatively applies to cases where zero-field splittings are significant, and hence where $\tau_c$ may also have an orientation dependence.

The relaxivity expressed by Equation 1 is applicable to a situation in which all optorelaxer molecules are in the photoparamagnetic excited state. This would be true for an excited state lifetime $\tau_{exc}$ larger than the $T_1$ in the dark of those nuclei closest to the optorelaxer molecules, and for a sufficient photon flux and optical quantum efficiency such that after some short period of time all optorelaxer molecules have been photoexcited. The experimental results reported here appear to approximate such a regime. A reduction in relaxivity would result from a $\tau_{exc}$ shorter than the $T_1$ in the dark of those nuclei closest to the optorelaxer molecules. Here, each optorelaxer molecule will spend a statistically identical fraction of time in the non-magnetic ground state, thus reducing its effectiveness in relaxing nearby nuclear spins. Even for such cases the reduced relaxivity could be sufficient to be worthwhile.

For the situation in which Equation 1 is applied to describe the relaxation of a large number of independent non-interacting nuclear spins at sites in a sample with different values of r and $\theta$ with respect to a single paramagnetic species, the summed magnetization recovery after saturation of the ensemble of spins will be characterized not by a single-exponential time constant $T_1$, but instead by multiexponential behavior. This has been shown to follow a stretched-exponential form with the recovery of magnetization M given by $M(t)=M_0(1-\exp[-(t/T_1')^\beta])$. This involves a new time constant $T_1'$ and a stretched exponent $\beta$ which is typically 0.5-0.7, with 0.5 representing a theoretical limiting value for dilute paramagnetic species. A Gaussian distribution of $T_1$ values has been shown to yield a $\beta$ equal to $\frac{2}{3}$. Comparisons of optorelaxer performance in such cases could be made by comparing the different values of $T_1'$ as long as $\beta$ remained constant. For a sample having nuclear sites that interact strongly with each other via homonuclear dipolar couplings, rapid spin diffusion leads to nearly single-exponential behavior. The single $T_1$ value is then largely determined by two factors: 1) the total number of homonuclear spins; and 2) the number and relaxation rates of a "core" of spins that are nearer to and most rapidly relaxed by the paramagnetic center, but whose hyperfine-shifted resonance frequencies are less than the homonuclear dipolar linewidth. The observed $T_1$ of these latter core protons will be described by Equation 1. In the Examples, solutions of the differential equations that involve spin-diffusion in the polystyrene matrix sample containing optorelaxer are given that illustrate this nearly single-exponential behavior.

Additional improvements in sensitivity may be achievable by a combination of optorelaxer methodology and Dynamic Nuclear Polarization (DNP), in NMR probes that allow for illumination by both light and microwaves. The transient unpaired electron spins generated by light can serve to enhance nuclear spin polarization by the DNP effect under microwave irradiation. The advantage over simple DNP is that much higher concentrations of unpaired electron spins are feasible, since no additional spectral broadening results from using optorelaxers whose photomagnetism is absent during data acquisition.

EXAMPLES

The invention will now be particularly described by way of example. However, it will be apparent to one skilled in the art that the specific details are not required in order to practice the invention. The following descriptions of specific embodiments of the present invention are presented for purposes of illustration and description. They are not intended to be exhaustive of or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated.

Example 1

$^1$H NMR experiments were conducted to demonstrate the ability to decrease $T_1$ in a sample by means of the LIESST (Light Induced Excited State Spin Trapping) effect in Fe(II) (ptz)$_6$(BF$_4$)$_2$, (ptz=1-propyltetrazole), abbreviated FePTZ.

When FePTZ at 30 K in a 7.0 T field was illuminated with white light, the $T_1$ decreased due to formation of a high-spin (S=2) photoexcited state from the low-spin (S=0) ground state of the d$_6$ Fe(II) center. The static $^1$H NMR at 30 K of FePTZ prepared in a matrix of polystyrene (PS, 0.88 mol % FePTZ on a monomer basis) shows two effects upon $^1$H T$_1$ behavior. Both effects are analyzed by numerical modeling of the spin-diffusion processes from the protons in a FePTZ core to those in a shell of polystyrene, under both light and dark conditions. In the dark, a combination of motion of the six methyl groups of FePTZ and possible residual paramagnetism results in an observed 20-fold reduction in $T_1$ from that of pure PS at the same temperature that is accounted for by the model. This indicates that FePTZ is well-dispersed in the PS matrix, and suggests that doping a proton-rich matrix with a compound like FePTZ having rotating methyl groups can significantly decrease $^1$H T$_1$ values at low temperature via spin diffusion, offering improved detection sensitivity. An approximately 2-fold reduction in $^1$H T$_1$ was observed upon illumination with white light at 30 K, without any attempted optimization of conditions. This establishes that the LIESST effect occurs for FePTZ in this polymer matrix and at 7.0 T. The model accounts for the observed reduction in the proton T$_1$ of the entire sample via rapid spin diffusion from photoexcited optorelaxer molecules in a matrix.

1.1. Sample Preparation.

The synthesis of FePTZ was carried out using a preparation altered from a previously-published method (Feng, X. W., et al., "Tristability in a Light-Actuated Single-Molecule Magnet," *JACS* 135(42):15880-4 (2013)). Under an inert atmosphere, in equimolar ratios n-propylamine hydrochloride, sodium azide, and triethyl orthoformate were dissolved in 30 M equiv. degassed glacial acetic acid and heated for eighteen hours at 90° C. The resultant slurry was concentrated to remove solvent, to which 80 M equiv. of 4N HCl (aq.) was then slowly added in addition to distilled water. Ethyl acetate was added and the mixture stirred while sodium bicarbonate was added until a neutral pH was reached. The crude product was extracted into the organic layer and separated with the help of brine. Carbon black was added to the slightly yellow organic layer and filtered through a celite cake. The organic layer was then dried with magnesium sulfate, filtered through cotton, and concentrated under reduced pressure to yield 1-propyltetrazole (PTZ) as a clear oil in a 39% yield. Confirmation of the product was made by the $^1$H NMR spectrum in $d_3$-chloroform, which displayed a singlet for the lone aromatic proton at 8.73 ppm, and by $^{13}$C NMR, which revealed a single aromatic carbon at 142.57 ppm. Both results are consistent with previously reported data. The oil was diluted with ethanol to make a 2 M stock solution, which was stored in the freezer. In a separate reaction vessel under an inert atmosphere, Fe$(BF_4)_2.6H_2O$ was diluted to a 0.33 M solution with previously degassed ethanol in the absence of light. While stirring, 6 equiv. of the tetrazole solution was slowly added and the reaction stirred at room temperature (not to exceed 40° C.) for four hours in the absence of light. The cloudy-white reaction mixture revealed a white precipitant once filtered and further dried under vacuum. The desired product, FePTZ or $Fe(PTZ)_6(BF_4)_2$, was isolated in a 43% yield, stored in the freezer, and used as isolated. Confirmation of the targeted product was determined by elemental analysis for $FeC_{24}H_{48}N_{24}B_2F_8$, calculated for C, H, and N to be 31.94%, 5.29%, 37.26%, and found for C, H, and N to be 31.99%, 5.29%, and 37.26%, respectively. FePTZ/PS films were made by dissolving FePTZ and polystyrene (Mw 200,000-300,000) in chloroform and tetrahydrofuran, respectively, combining the two solutions, and then allowing the solvent to slowly evaporate. The proportions were chosen to produce a film with 0.88 mol % FePTZ per PS monomer. Successful films were quickly tested for a color change from clear/white (HS form) to pink (LS form) upon cooling with liquid nitrogen to confirm FePTZ was thoroughly incorporated throughout the film.

1.2. Optical Source.

A 4 watt Prizmatix LED white light source with a custom higher color temperature provided light over a continuous range from ~440-740 nm (20% of maximum intensity levels) with some peaking around 455 nm and 540 nm. The output of this source, UHP-T-LED (high CRI), was controlled by the UHPLCC-T Controller, and was directed through a 1.5 m LLG-A 3 mm liquid light guide with a LLG-A Adaptor. The output of the LLG was partly collimated with a series of lenses and directed into the bore of the magnet with a mirror. A filter from Thorlabs (335-610 nm) was used to avoid the reverse-LIESST excitation near 800 nm. The power after this LLG and collimator was measured to be 1.02 W, although only a fraction of this light reached the sample.

1.3. NMR Experiments.

Bruker DMX-300 and Tecmag Apollo NMR spectrometers operating at 7.05 T IDC-(300 MHz $^1$H Larmor frequency) were used with a homebuilt probe optimized for a Janis gas flow temperature-regulated cryostat with sapphire window(s) operating down to 4.2 K with liquid helium or 77 K with liquid nitrogen. The $^1$H rf field strength was typically ~50 kHz. Spin-lattice relaxation was measured using saturation recovery, with 25 pulses used to saturate the spectrum prior to a single excitation pulse. For the $^1$H and $^{13}$C MAS-NMR experiments a Varian/Agilent DDRS-500 spectrometer at 11.7 T for 1H (500 MHz) and $^{13}$C MAS-NMR with a triple-resonance 4.0 mm MAS probe was used.

The saturation recovery data were analyzed using linear programming (LP) to obtain $T_1$ values without making any assumptions about the number of exponential recovery times involved or the nature of their distribution. The limits of misfit in LP are estimated for each point in the recovery curve based on the standard deviation of the last half of the points in the FID. These limits are scaled to fit the data. The scaling factor is limited to the range of 1 to 12 with typical values close to one. This processing was used to reduce the effects of coherent cw pickup observed in some FIDs. In general, each data set contains multiple measurements of the $T_1$ relaxation time. A single $T_1$ value was calculated from the weighted mean (first moment) of the $T_1$ values obtained from LP. Reported values of $T_1$ are median values of multiple measurements determined after removing outliers.

1.4. $^1$H Static and MAS-NMR of FePTZ.

Figure 5A:
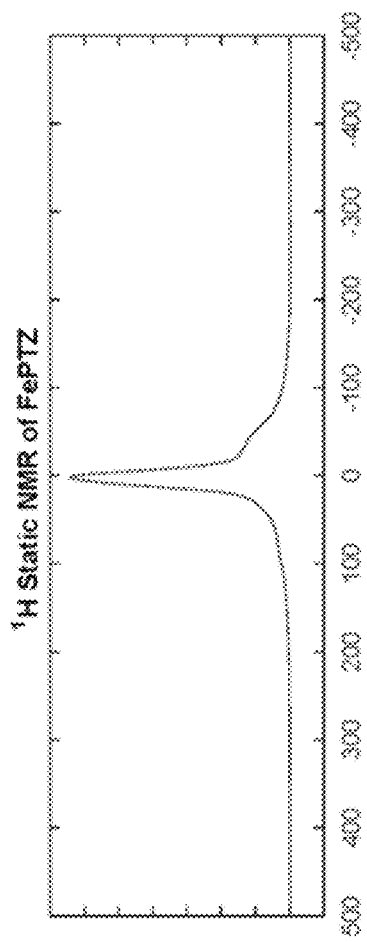
FIG. 5A depicts an $^1H$ static spectrum of FePTZ at ambient temperature, which is narrowed by the rotation of the methylene chains and methyl rotation.
Figure 5B:
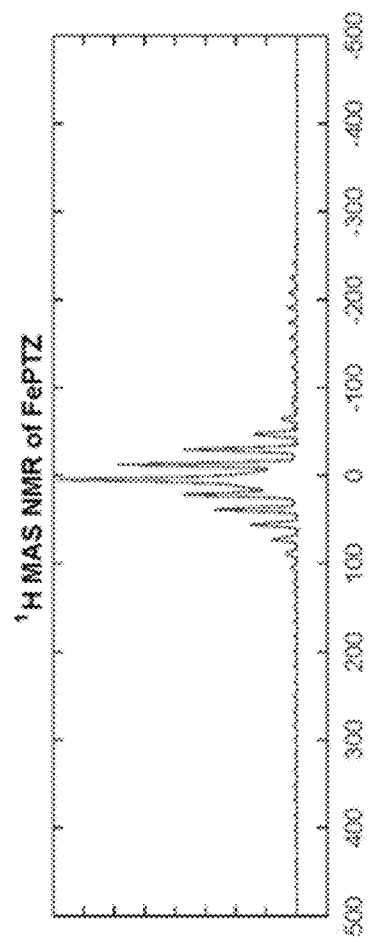
FIG. 5B depicts an $^1H$ MAS-NMR spectrum of FePTZ at ambient temperature.
Figure 5C:
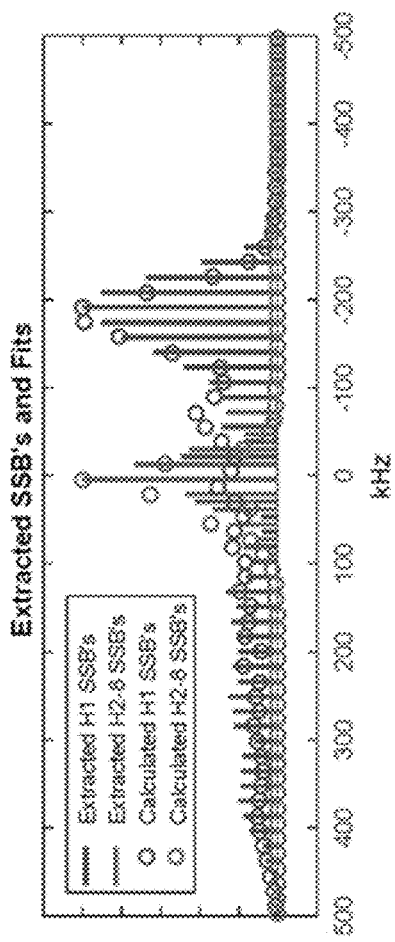
FIG. 5C depicts a spectra that show both experimental and calculated spinning sideband intensities.

The $^1$H static and MAS-NMR spectra of FePTZ in its HS form at ambient temperature are shown in FIGS. 5A-5C. The static $^1$H NMR at 2.0 T of this complex and its diamagnetic Zn(II) analogue has been studied (linewidths, second moments, and $T_1$ as a function of temperature). Reorientation of the methylene chains as well as methyl group rotation was observed at ambient temperature. The nearly 6-fold greater $B_0$ in this experiment leads to a much greater contribution from paramagnetic inhomogeneous broadening effects upon the lineshape.

The $^1$H MAS-NMR spectrum in FIGS. 5A-5C reveal a large signal centered at 7.1 ppm relative to TMS with a set of spinning sidebands (SSB) that originate largely from the inhomogeneous broadening due to the electron-nuclear dipolar interaction in this HS form of the complex, although the motionally-averaged homonuclear dipolar interactions also contribute. In addition to this large signal and its associated SSB, a much weaker set of SSB is spread over approximately 1 MHz in the MAS spectrum. FIGS. 5A and 5B show that the $^1$H static (5A) and MAS-NMR (5B) spectra of FePTZ at ambient temperature. The spectrum in FIG. 5A is narrowed by the rotation of the methylene chains and methyl rotation. The spectrum in FIG. 5C shows both experimental and calculated spinning sideband intensities.

Figure 6:
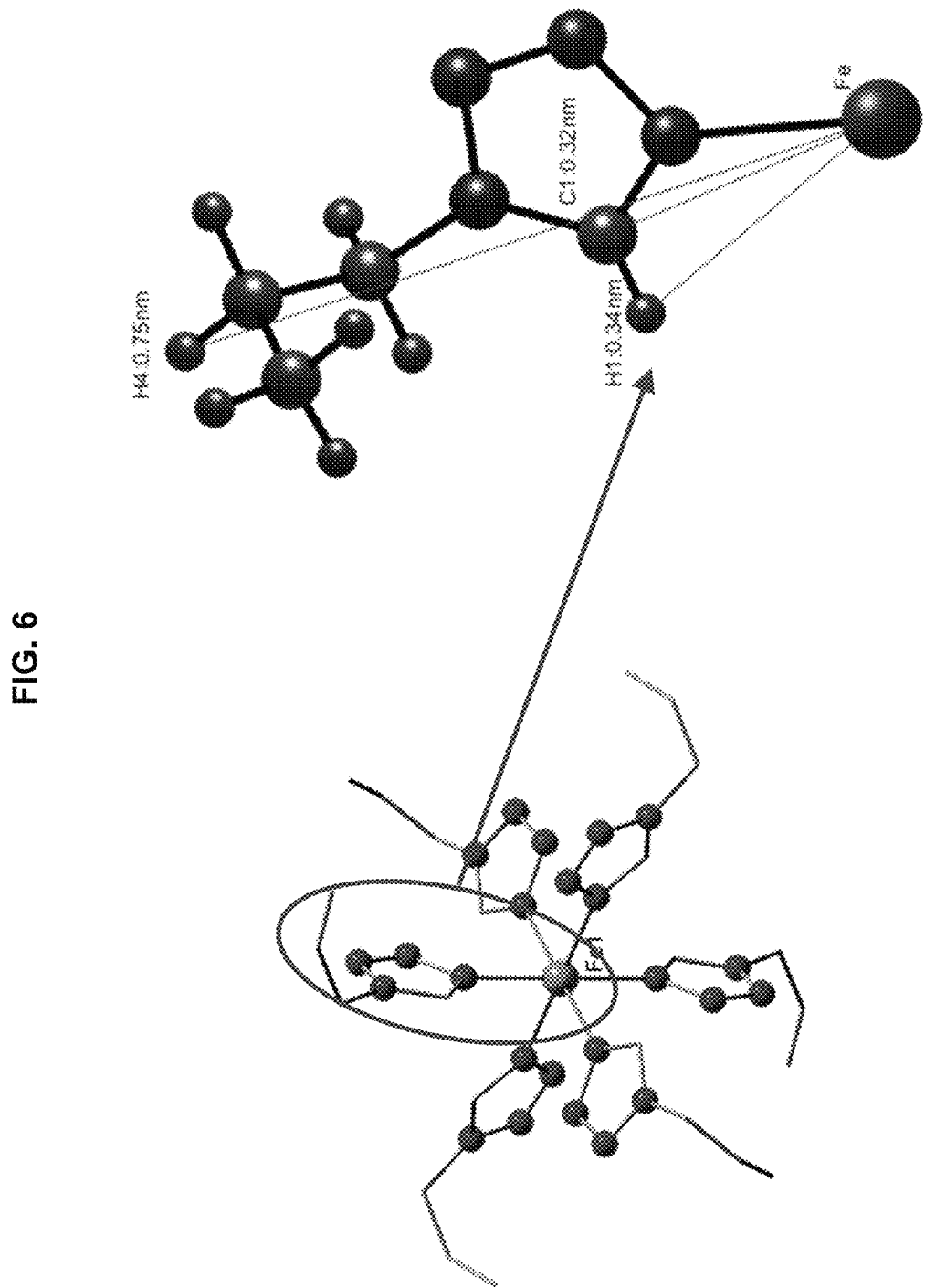
FIG. 6 depicts the structure of FePTZ and relevant proton-Fe(II) distances derived from crystal structure data.

The ratio of the integral of these sidebands to the integral of the sidebands associated with the main peak is consistent with the weak peak arising from proton H1 on the tetrazole ring. (See FIG. 6, structure of FePTZ and relevant proton-Fe(II) distances from the crystal structure data in Lakhloufi, S., et al., "Structural phase transition in the spin-crossover complex Fe(ptz)(6)(BF4)(2) studied by x-ray diffraction," *Physical Review B*, 82(13):4 (2010)). Proton H1 is significantly closer to the Fe center than all other protons.) The strong peak at 7.1 ppm represents an average shift for the H2-H8 protons, which are not individually resolved, and differs by +5.1 ppm from the average shifts of H2-H8 in the free ligand in $CD_3Cl$ solution at 7.0 T of +2.0 ppm. This shift difference of +5.1 ppm (+2.5 kHz) from the uncomplexed ligand is due to a combination of Fermi contact and pseudo-contact interactions as well as the chemical shift change due to ligand complexation. The H2-H8 SSB are consistent with an axially-symmetric anisotropic hyperfine dipolar coupling of roughly 100 kHz, the exact value used in the simulation in FIGS. 5A-5C (which ignores both the differences in the dipolar couplings for protons H2 to H8, as well as an insufficient rf excitation bandwidth).

The H1 sidebands are consistent with a large axially-symmetric hyperfine dipolar coupling of 450 kHz, as shown in the simulation in FIGS. 5A-5C. The isotropic shift of H1 differs by −19.0 ppm (−9.5 kHz) from the chemical shift of H1 in the free ligand in $CD_3Cl$ (at +8.7 ppm from TMS). This shift difference, like that for the H2-H8 protons, also arises from a combination of Fermi contact and pseudocontact interactions as well as the chemical shift change due to ligand complexation. Both simulations of SSB intensities neglected the motionally-averaged homonuclear dipolar interactions.

The $^1H$ MAS-NMR spectrum was observed to broaden as the temperature was lowered, perhaps due to interference between MAS and propyl group dynamics. The $^{13}C$ CP-MAS NMR spectrum (data not shown) also exhibited sharp peaks with spinning sidebands over a wide spectral range and a hyperfine contact shift for the carbon in the tetrazole ring of over 100 kHz.

In considering what these results might imply for the photoexcited HS form at low temperature, note that there are actually at least two distinct phases of this form. Which photoexcited phase is produced depends upon which of two distinct low temperature ground state LS forms is present, and this depends upon the rate of cooling of the initial high temperature HSα form. Rapid cooling (~100 K/min) results in a $LS_\beta$ form that upon photoexcitation with 505 nm light produces a $HS_\beta^*$ form, both having the R3bar symmetry of the parent structure (axial $D_{3d}$ local symmetry). In contrast, slow cooling (e.g., 0.4 K/min) produces a low-symmetry form $LS_\alpha$, at least for the pure complex. Upon photoexcitation this $LS_\alpha$ form produces a $HS_\alpha^*$ form that is believed to have low-symmetry, despite the lack of crystallographic structural information.

The large anisotropic hyperfine interactions observed in the $^1H$ MAS-NMR spectrum of the $HS_\alpha$ form at ambient temperature will be influenced by large zero-field splitting parameters, which were deduced from the EPR of the photoexcited $HS_\beta^*$ form, since molecules in both forms have local D3d symmetry. However, the anisotropic hyperfine interactions estimated from the $^1H$ MAS-NMR spectra cannot be used to predict the appearance of the $^1H$ static NMR spectrum of the low-symmetry $HS_\alpha^*$ form at 30 K. This is because EPR spectra indicate differences in the zero-field parameters between the $HS_\beta^*$ and $HS_\alpha^*$ forms. It is however possible to infer at least what the temperature-dependence of inhomogeneous broadening in the $^1H$ NMR spectrum due to electron-nuclear hyperfine interactions would be for one of these two photoexcited low temperature forms. This can be done from the reported temperature dependence of the magnetic susceptibility of a photoexcited HS form of FePTZ below 50 K, although it was not determined which photoexcited form was created. A temperature-independent effective magnetic moment was calculated in this study from the product of magnetic susceptibility and $T^{1/2}$, which is characteristic of a magnetic susceptibility varying as 1/T (Curie behavior). The thermally-averaged electron magnetic moment that produces the electron-nuclear hyperfine dipolar coupling is then proportional to the magnetic susceptibility, having a 1/T temperature dependence. This would imply a substantial increase in the hyperfine coupling and resultant inhomogeneous linewidth of the spectrum as the temperature is lowered, 6-fold upon going from 30 K to 5 K for example. Such a large increase would result in an increase in the spin-diffusion barrier radius as well, with implications for relaxivity.

1.5. $^1H$ NMR of FePTZ: Temperature and Light Effects.

The saturation-recovery behavior of FePTZ was measured over the temperature range 30-295 K (data not shown). The $T_1$ values showed an increase upon cooling from 0.1 s at 290 K to 2.4 s at 30 K, reflecting the HS→LS transition. Because a slow cooling rate was used for the multiple measurements, the low-symmetry $LS_\alpha$ form (see above) is assumed to have formed. Differences in $T_1$ values between the FePTZ sample at the same temperature but having a different thermal history are perhaps due to residual traces of the HS form that have been observed by magnetic measurements on cooled samples with incomplete thermal SCO transitions. The $T_1$ values measured are roughly comparable to those reported previously at 2.0 T.

For the first time an increased spin-lattice relaxation rate for an SCO complex induced by the LIESST effect has been observed. Irradiation of FePTZ at 30 K with unfiltered white light resulted in a reduction of the median $^1H$ $T_1$ from 2.4 s in the dark to a steady-state value of 0.42 s in the light. This reduction in $T_1$ is likely less dramatic than it would otherwise be due to dark relaxation from two sources, rotating methyl groups on the ligands that relax protons and trapped traces of the HS form. However, the observed reduction in $T_1$ upon illumination is more dramatic than when the light is filtered with a band pass of 335-610 nm; in that case the $T_1$ is reduced to 1.5 s. It is unclear why the filtered light is less effective at exciting the high spin state.

$T_1$ was measured as a function of illumination time to measure the rate of conversion to the high spin state. No time evolution of the relaxation rates extracted from the data was observed, suggesting that the relaxation rate reached a steady state value during the first measurement of $T_1$, which took 35 minutes. Previous measurements indicated a conversion time with low light intensity at 10 K of several hours. The possibility that rapid back-conversion to the LS state might have resulted in a dynamic steady state while the light was on was investigated by illuminating the sample with unfiltered light for several hours before turning the light off and making several measurements of $T_1$ over the course of approximately two hours. The value of $T_1$ in the dark was 0.49 s, close to the value of 0.42 s with the light on. These results indicate that back-conversion to the LS state did not contribute to the rapid approach to steady state with the light on.

The effects of rapidly cooling the sample by immersing the probe and sample in liquid nitrogen inside the cryostat and subsequently removing the nitrogen and cooling to 30 K with helium gas was investigated. The rapidly cooled sample has a much shorter $T_1$ of 0.59 s in the dark than the slowly cooled sample. The shorter $T_1$ may be due to a higher fraction of trapped residual paramagnetism than that present in the slowly cooled sample. Likewise, the rapidly cooled sample illuminated with filtered light has a much shorter $T_1$ value of 0.31 s than the slowly cooled sample under similar illumination conditions. Further evidence that the shorter relaxation times are due to residual paramagnetism comes from the linewidths of the NMR spectra. The LS form of the slowly cooled sample has a full width at half maximum (FWHM) of 56 kHz whereas the nominal LS form of the rapidly cooled sample has a FWHM of 103 kHz, and the rapidly cooled HS form has a FWHM of 134 kHz. (The integrated amplitude of the rapidly cooled HS form is smaller than that of the corresponding LS form, which may indicate that the full linewidth is not being excited.) For comparison, the HS form of the slowly cooled sample, illuminated with unfiltered light, has a FWHM of 70 kHz.

The answer to the question what value for the electron spin correlation time $\tau_c$ in Equation 1 is relevant for photoexcited FePTZ is a complicated one. For FePTZ in the $HS_\alpha$ form (above the transition temperature) the $^1H\ T_1$ data at 2.0 T were argued to support a value for $\tau_c$ of 10-13 s (but see below). A similar type of analysis using the approach of Lowe and Tse (Lowe, I. J. and D. Tse, "Nuclear spin-lattice relaxation via paramagnetic centers," *Physical Review*, 166 (2):279 (1968)) for a different Fe(II) SCO complex at 2.1 T yielded somewhat larger estimates for $\tau_c$ of $4.6$-$7.4 \times 10^{-12}$ s. The constancy of $\tau_c$ inferred from the constancy of $T_1$ over the entire temperature range of the HS region of several Fe(II) SCO complexes indicated that the major mechanism contributing to $\tau_c$ was spin exchange between neighboring paramagnetic ions. However, a temperature dependence of $\tau_c$ was deduced from the temperature dependence of $T_1$ in the above study of FePTZ (Bokor, M., et al., "Solid-state NMR of 1-propyltetrazole complexes of iron(II) and zinc (II). 1. H-1 spin-lattice relaxation time," *J. Mag. Res. Series A*, 122(2):157-64 (1996)), with the longest $\tau_c$ above the transition temperature being about 10-12 s, which yielded a $T_1$ relaxation time minimum for the H1 proton closest (0.34 nm) to the Fe(II) and the other 7 ligand protons in rapid spin-diffusion contact of about 10 ms. One reason spin-exchange did not appear to lead to a temperature-independent $\tau_c$ in the case of FePTZ might be a greater distance between Fe(II) centers because of the bulkier 1-propyltetrazole ligands. It is worth noting in the context of what might be achieved in an optorelaxer experiment involving isolated FePTZ molecules (discussed below) that a $\tau_c$ three orders of magnitude longer than $10^{-12}$ would be expected to yield a much shorter $^1HT_1^*$ than observed here.

1.6. $^1H$ NMR of FePTZ in Polystyrene: Temperature and Light Effects.

Sections 1.4 and 1.5 (above) dealt with the behavior of polycrystalline FePTZ. The LIES ST effect in FePTZ has been shown to be essentially a single-ion property not involving cooperative interactions with the lattice, unlike the thermally induced SCO effect. However, although studies of other Fe(II) complexes embedded in polymer and other non-crystalline matrices have demonstrated LIESST behavior, it appears that FePTZ has not been thus investigated. Demonstrating the optorelaxer behavior of FePTZ in such a matrix, i.e., a reduction in $T_1$ upon illumination, is thus a desirable proof-of-principle for NMR applications that rely on spin-diffusion among the abundant proton spins of the matrix to transport the thermal polarization rapidly generated at the optorelaxer molecule.

The $^1H\ T_1$ values measured for the FePTZ/PS sample in the dark at temperatures down to 80 K indicated that FePTZ molecules in the matrix exhibited a thermal transition between HS and LS forms, as indicated by the sample color change. The data suggest that the thermal transition is somewhat broader than that observed in crystalline FePTZ, which is to be expected for a heterogeneous range of environments of the FePTZ molecule in the amorphous matrix.

Figure 7:
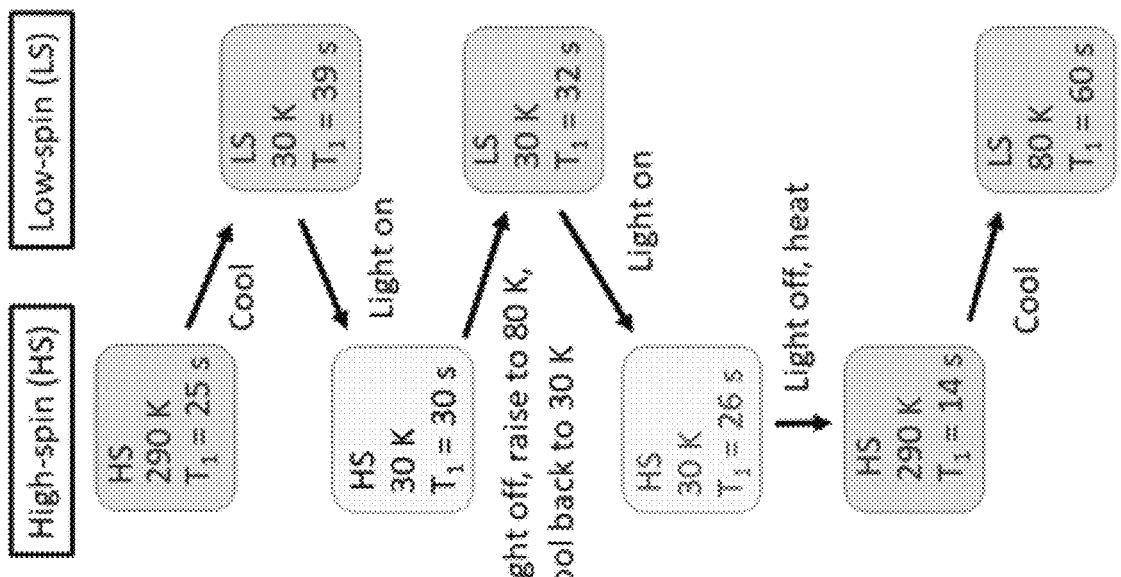
FIG. 7 depicts the sequential effects of changing temperature and illumination conditions on the $^1H$ NMR $T_1$ (determined as the mean value from LP analysis) of FePTZ/PS.

The spin lattice relaxation behavior of the FePTZ/PS sample was determined under either dark or light conditions at three different temperatures (290 K, 80 K, and 30 K), and with thermal cycling to 80 K as an intermediate step to trigger the change between photoexcited HS and ground state LS forms. The time sequence of the experiments is shown in FIG. 7, along with the measured $T_1$ values and columns representing the presumed dominant spin state of the Fe(II) center (HS or LS).

Although the reported $T_1$ is the median value of multiple measurements, the individual data sets were also analyzed for the case of light on at 30 K. This was done, just as it was for the pure complex, in order to obtain some idea of the time scale over which the $T_1$ reduction seen from FIG. 7 took place. For multiple data sets acquired for 16 hours after the light was turned on, it appeared that by the first data set acquired within 0.5 hours of turning on the light the $T_1$ had essentially plateaued to its final reduced value.

These results were compared to the predictions of a model of relaxation behavior in the absence and presence of light. The model is similar to one used in the characterization of the optical pumping process in InP, but in this case included only relaxation and diffusion terms:

$$\frac{\partial \mathcal{M}}{\partial t} = D \nabla^2 \mathcal{M} + \frac{1}{T_1(r)}[1 - \mathcal{M}], \qquad \text{Equation 2}$$

where D is the spin diffusion coefficient, and $1/T_1(r) = R_1(r)$ is the relaxation rate of protons at a distance r from the center of the nearest FePTZ molecule. Values for r span the range 0 to half the mean distance between FePTZ molecules. The model is one-dimensional and assumes spherical symmetry, and thus the angular terms in Equation 1 (above) do not appear. The model treats the material as a core-shell particle: a single FePTZ molecule is the core surrounded by a shell of PS polymer matrix, successive shells constituting a volume of influence (VOI). Two scenarios are treated: (1) relaxation in the dark, and (2) relaxation under illumination. In the dark the relaxation time in the core is assumed to be the measured relaxation time of FePTZ at 30 K, designated $T_1^{FePTZ(LS)}$. Ideally this relaxation time would be determined by the significant contribution from ligand methyl group rotations. There is, however, a possible additional effective contribution to $T_1^{FePTZ(LS)}$ from Fe(II) centers trapped in a HS form in the FePTZ crystallites. Trace fixed paramagnetic impurities may also contribute to relaxation, since Co(II) and Mn(II) have been identified as impurities by EPR in a different FePTZ sample. Since these paramagnetic centers are likely to be randomly situated, the fact that the model treats them as fractionally contributing to each site is an oversimplification. However, it is justified by the lack of knowledge of the fraction(s) of such trapped paramagnetic centers at 30 K in both FePTZ as well as in FePTZ/PS, and of any fixed paramagnetic impurity concentration. The shell has the intrinsic relaxation time of PS, $T_1^{PS}$, leading to $R_1(r, t=-0) = 1/T_1^{FePTZ(LS)}$ for $r \leq a_0$ and $R_1(r, t=-0) = 1/T_1^{PS}$ for $r > a_0$, where $a_0$ is the radius of the core. The relaxation rates of the two regions are coupled by spin diffusion. When FePTZ is in the HS state the coupling between the nuclei and electrons is predominantly dipolar in nature, leading to $R_1(r) = 1/T_1^{FePTZ(HS)}$ for $r \leq a_0$ and $R_1(r) = [T_1^{FePTZ(HS)}(r/a_0)_6] + [1/T_1^{PS}]$ for $r > a_0$. The time $T_1^{FePTZ(HS)}$ represents a composite relaxation time of the core for the 6 tetrazole protons and 42 propyl protons of FePTZ in the HS state. For the shell, this value is scaled by $(r/a_0)^{-6}$ to approximate the decrease in relaxation rate from the hyperfine dipolar interaction with increasing r. Again, the relaxation rate of the two regions is coupled by spin diffusion.

A MATLAB program was used to solve numerically the diffusion equation for the cases of LS and HS. The radius of the core was estimated by calculating the distance from Fe to the farthest part of the 1-propyltetrazole group using the crystal structure (see FIG. 6). The farthest atom from the iron is H4 (on the second methylene from the tetrazole ring) at 0.75 nm. These structural data were obtained at room temperature, but the decrease in volume of the FePTZ unit cell going from the HS form at 300 K to the LS form at 80 K is relatively small, 7.6%, and this includes the relatively sharp 2.4% reduction in volume around the transition temperature of about 130 K. Thus, obtaining the core radius from the room-temperature structure of FePTZ should result in only a slight overestimate of this radius for the LS form at 30 K, and even less so for that of the photoexcited HS form at 30 K. Based on the 0.88% molar concentration of FePTZ in PS (PS monomer basis) and the molar volume of PS, a shell radius of 1.63 nm is calculated. Also, although the room temperature molar volume of PS is used to calculate the distance between FePTZ molecules in the model, the decrease in the volume of the PS shell from thermal contraction at low temperature is negligible, corresponding to less than $10^{-3}$ in linear dimensions.

The spin diffusion coefficient D was calculated through the measured second moment of PS at 30 K, using equations 3 and 7 from Chapter V of Abragam, A., *The Principles of Nuclear Magnetism*, Oxford University Press, London, 1961. This resulted in D=583 $nm^2-s^{-1}$=0.6 $nm^2-ms^{-1}$. This value is reasonable, given the value obtained in PS/PMMA blends of 0.8 $nm^2-ms^{-1}$, and the smaller value measured for "local" spin diffusion in PS of 0.2 $nm^2-ms^{-1}$. This spin diffusion constant allows the spins in the VOI to equilibrate within a few milliseconds, much faster than the hundreds of milliseconds for spin relaxation within the core. Therefore, the modeling results below turn out to be insensitive to the exact value of D because the rapid spin-diffusion limit applies.

Figure 8:
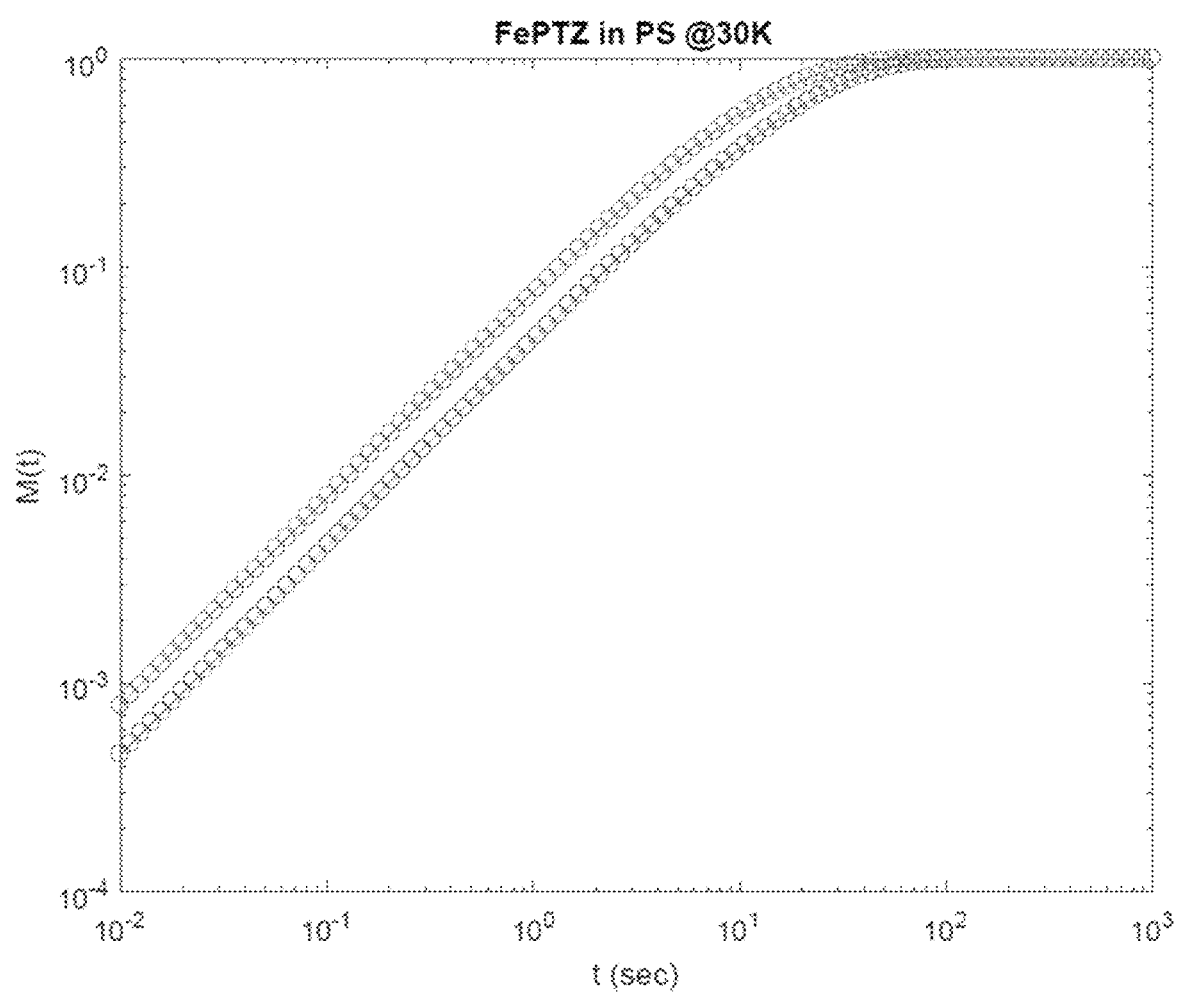
FIG. 8 depicts a numerical simulation of $^1H$ NMR magnetization recovery in FePTZ/PS at 30 K using a core/shell model. The lower curve corresponds to the LS form under dark conditions, and fits closely to a single-exponential $T_1$ of 22 s (experimental $T_1$=32 s). The upper curve corresponds to the HS form under white light illumination, and fits closely to a single-exponential $T_1$ of 13 s (experimental $T_1$=27 s).

FIG. 8 shows the time evolution of the $^1$H NMR magnetization signal predicted from numerical analysis using this core/shell model for FePTZ/PS at 30 K for both LS (dark) and HS (light on) forms of FePTZ. The lower curve corresponds to the LS form under dark conditions, and fits closely to a single-exponential $T_1$ of 22 s (experimental $T_1$=32 s). The upper curve corresponds to the HS form under white light illumination, and fits closely to a single-exponential $T_1$ of 13 s (experimental $T_1$=27 s). The core/shell model is able to qualitatively predict the experimentally observed reduction in the sample $T_1$ vis-à-vis pure PS from both optorelaxer methyl group relaxation (and possible trace paramagnetism) in the LS dark form as well as from the additional paramagnetic relaxation by the HS optorelaxer form under illumination.

The $T_1$ values predicted from the model for both dark and light conditions (LS and HS) are somewhat shorter than those experimentally observed (values given in FIG. 7 and noted in the caption to FIG. 8). Effectively reducing the density of optorelaxers by increasing the radius of the VOI by a factor of 1.15 yields a predicted $T_1$ value close to that experimentally observed for the dark (LS) case. An increase in the VOI could result from aggregation of FePTZ molecules in the PS matrix or from the presence of some nano- or micron-sized crystallites of FePTZ in the matrix, both of which would tend to reduce the relaxivity effect on a per optorelaxer molecule basis by reducing the "surface contact area" of the optorelaxer molecules with the matrix. Indeed X-ray powder diffraction (XRPD) data indicated the presence of some crystalline FePTZ in the FePTZ sample, although no kind of quantitation is possible because the peak intensities can depend so strongly upon the crystallite quality and mosaic structure. However, it is clear that if FePTZ were present almost entirely in crystalline form, even small nanocrystallites, spin diffusion would be incapable of relaxing the shell spins far removed from the crystallites.

For the light (HS) case the radius of the VOI was increased by a factor of 1.3 to allow the model to match the measured results. The larger radius needed for the HS case most likely indicates that not all the FePTZ is converted to HS by light in the PS matrix. The ratio of 1.15 to 1.3 is consistent with a 70% conversion to HS.

The combined experimental and modeling results above demonstrate that isolated optorelaxer molecules in a matrix, specifically FePTZ in PS, can serve to increase the overall $^1$H spin-lattice relaxation rate of the matrix under illumination conditions. Under the conditions of these experiments, this optorelaxer effect was modest, especially compared to the effects seen in the dark of methyl group rotation of the optorelaxer molecule (and possible trace paramagnetism). However, two key variables that help determine the efficacy of FePTZ as an optorelaxer are the fraction of optorelaxer existing in the HS photoexcited state at 30 K and the electron correlation time $\tau_c$ in Eq. 1. The observation above that the time-sequence of the $T_1$ effects from light irradiation indicated a steady-state plateau was rapidly reached suggests that all of the FePTZ molecules remained trapped as photoexcited species (as is known to be the case for the pure crystals of FePTZ below 50 K). As indicated above, the modeling for the light-on conditions would not predict the $T_1$ reduction observed if the fraction of photoexcited FePTZ molecules were substantially less than the approximate 70% derived value. Therefore, it is most likely that a non-optimum value of $\tau_c$ in Eq. 1 leads to less efficient relaxation than desired.

As discussed above, for pure FePTZ in the $D_{3d}HS_\alpha$ form the $^1$H $T_1$ vs. temperature down to the thermal transition temperature of ca. 130 K enabled an Arrhenius formula for the temperature dependence of $\tau_c$ to be obtained. Simply evaluating this formula at 30 K gives a value for $\tau_c$ of 17 ns, which is longer than the 0.5 ns value at the $T_1$ minimum at 300 MHz ($\omega_I \tau_c$=1 in Equation 1). However, this procedure is not likely to be valid because the low symmetry photoexcited $HS_\alpha^*$ form produced from slow cooling of the sample would be expected to have a different temperature dependence from the high-symmetry $HS_\alpha$ form, as would any lower symmetry photoexcited HS form produced within an amorphous PS matrix. In reality, for FePTZ/PS there is likely to be a distribution of $\tau_c$ values. It may be possible to find an operating temperature that places the peak of any such distribution at the $T_1$ minimum value for $\tau_c$, while still maintaining a sufficiently long lifetime to trap photoexcited species.

That the actual $\tau_c$ in these experiments may be on the short correlation time side of the $T_1$ minimum curve is suggested by the observation that for high-spin Fe(II) complexes spin-orbit coupling within the $^5T_2$ state leads to $\tau_c$ values so short that EPR spectra can only be obtained at temperatures around 20 K or lower. It is interesting to note that the rapidly-cooled $HS_\beta^*$ phase (whose axial-symmetry structure is known) shows single-molecular magnetic (SMM) behavior (slow thermally-activated relaxation between $m_z$=+2 and −2 levels in DC fields), whereas the slow-cooled $HS_\alpha^*$ phase (structure unknown) lacks axial symmetry and does not have SMM behavior. If SMM behavior existed in the photoexcited FePTZ/PS sample, it would be expected to lead to a much larger electron-nuclear hyperfine interaction because the magnetic moment would no longer be thermally averaged. In such a case a long thermally-activated ro value might be expected to have minimal effects upon the $^1$H $T_1$ relaxation, according to Equation 1.

1.7. Conclusions.

An approach has been provided for increasing the detection sensitivity of NMR by introducing into the sample optorelaxer molecules that form transient paramagnetic species under irradiation with light. The resultant transient photoparamagnetism serves to reduce nuclear spin-lattice relaxation times $T_1$, thus permitting more rapid data acquisition, while offering the prospect of being absent during the acquisition of the free-induction decay, thus avoiding any degradation in resolution caused by spectral broadening from paramagnetic species. Different modalities of optorelaxer incorporation into samples have been described, e.g., dissolving or suspending the substance to be investigated and forming an amorphous matrix at low temperatures. Distinctions have been made between direct relaxation of the NMR nucleus of interest by the optorelaxer, and reliance upon optorelaxer relaxation of an abundant spin reservoir via spin-diffusion.

A first experimental demonstration of the optorelaxer concept for this last case has been obtained. A reduction in the $^1$H NMR $T_1$ values at 30 K upon illumination with white light is observed for the LIESST complex FePTZ, both as a pure polycrystalline powder as well as for the complex dispersed in a polymer matrix of PS. Comparison of experimental results with numerical modeling of the spin-diffusion process in this latter FePTZ/PS sample under dark conditions reveals that the combination of methyl group rotation and possible residual paramagnetism in the FePTZ optorelaxer molecule is highly effective in relaxing the protons in the polymer matrix. Under illumination of the FePTZ/PS sample, experimental results and modeling indicate a further decrease in $T_1$ attributable to the optorelaxer effect. Significant improvements may be possible by adjusting the effective relaxivity of the photoexcited optorelaxer molecule by operating at a temperature where the electron spin correlation time ro is closer to the inverse nuclear Larmor frequency (i.e., near the $T_1$ minimum in Equation 1). Also, the experiments reported here relied upon a time-consuming thermal cycling to remove the transient photomagnetism, but operating at a somewhat higher temperature would give a shorter excited state lifetime that would allow the photoparamagnetism to decay more rapidly. It remains to be seen whether such a change would be beneficial in terms of the resultant change in $\tau_c$. An alternative approach exists. The FePTZ optorelaxer has been previously shown, in the pure complex at least, to have its transient photomagnetism destroyed by irradiation at a longer wavelength around 800 nm. Thus, irradiation with dual wavelength regions is a possible approach to implement the complete optorelaxer concept with FePTZ. Other types of potential optorelaxer molecules may simply depend upon having decay times for the photoexcited paramagnetic states that are sufficiently short to match the requirements of a particular NMR experiment.

The possibility of being able to carry out DNP-type experiments (such as MIONP) with optorelaxers is an intriguing one, since in principle the concentrations of optorelaxers used could be much higher than those of the permanent radicals or biradicals typically used, without suffering loss of resolution.

Another future possibility is that optorelaxers functionalized with specific binding or recognition sites could be employed to obtain structural distance information between the electron spin and various nuclear spins based upon distance-dependent spin-lattice relaxation effects, similar to what has been shown for $^{13}$C NMR in a paramagnetic-ion labeled protein. In addition to potentially maintaining high resolution in relaxation time experiments, the use of an optorelaxer as label could take advantage of the ability to monitor spectral broadening effects from dipolar electron-nucleus hyperfine interactions. In a 2D NMR experiment, these interactions could be active during the light-on evolution during $t_1$ while absent during the light-off $t_2$ evolution.

In summary, we have shown that illumination with white light of a polymer matrix containing an optorelaxer based upon an Fe(II) complex can reduce the $^1$H spin-lattice relaxation time $T_1$ of the matrix via spin diffusion from photoexcited optorelaxer molecules.

It will, of course, be appreciated that the above description has been given by way of example only and that modifications in detail may be made within the scope of the present invention.

Throughout this application, various patents and publications have been cited. The disclosures of these patents and publications in their entireties are hereby incorporated by reference into this application, in order to more fully describe the state of the art to which this invention pertains.

The invention is capable of modification, alteration, and equivalents in form and function, as will occur to those ordinarily skilled in the pertinent arts having the benefit of this disclosure. While the present invention has been described with respect to what are presently considered the preferred embodiments, the invention is not so limited. To the contrary, the invention is intended to cover various modifications and equivalent arrangements included within the spirit and scope of the description provided above.

What is claimed:

1. A method for conducting nuclear magnetic resonance (NMR) spectroscopy, comprising:
    providing a sample for NMR analysis;
    adding an optorelaxer to the sample;
    exposing the sample and the optorelaxer to a first light condition that causes the optorelaxer to adopt a paramagnetic form;
    exposing the sample and the optorelaxer to a second light condition that causes the optorelaxer to adopt a diamagnetic form;
    applying a radiofrequency pulse to the sample and the paramagnetic form of the optorelaxer; and
    obtaining a signal from the sample in the presence of the diamagnetic form of the optorelaxer.

2. The method of claim 1, wherein the steps of exposing to the first light condition, exposing to the second light condition, applying a radiofrequency pulse, and obtaining the signal are repeated to obtain an NMR spectrum.

3. The method of claim 2, wherein the NMR spectrum has increased sensitivity as compared to an NMR spectrum obtained without the optorelaxer.

4. The method of claim 1, wherein the optorelaxer shortens a spin-lattice relaxation time, resulting in more scans over a period of time than a sample analyzed without adding the optorelaxer.

5. The method of claim 1, wherein the optorelaxer is a spin-crossover (SCO) complex exhibiting light-induced excited state spin trapping (LIESST) effects.

6. The method of claim 5, wherein the optorelaxer is selected from the group consisting of $Fe(II)(ptz)_6(BF_4)_2$ ("FePTZ"), $Fe(II)(NH_2trz)_3(BF_4)_2$ ("FeTRZ"), $Fe(phen)_2(NCS)_2$, $Fe(btzp)_3(ClO_4)_2$, $CrI_2(depe)_2$, and $[Fe(bpym)(NCS)_2]_2$bpym.

7. The method of claim 1, wherein the first light condition is selected from the group consisting of visible light, ultraviolet light, and infrared light.

8. The method of claim 7, wherein the first light condition is visible light.

9. The method of claim 1, wherein the second light condition is darkness.

10. The method of claim 1, wherein the second light condition is light having a longer wavelength than the first light condition.

11. The method of claim 2, wherein measurements for the NMR spectrum are taken at a range of temperature from 4 K to 300 K.

* * * * *